(12) United States Patent
Umeda et al.

(10) Patent No.: US 10,998,857 B2
(45) Date of Patent: May 4, 2021

(54) RESONANCE DEVICE

(71) Applicant: Murata Manufacturing Co., Ltd., Nagaokakyo (JP)

(72) Inventors: Keiichi Umeda, Nagaokakyo (JP);
Tadayuki Okawa, Nagaokakyo (JP);
Taku Kamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/849,314

(22) Filed: Apr. 15, 2020

(65) Prior Publication Data
US 2020/0244222 A1  Jul. 30, 2020

Related U.S. Application Data

(63) Continuation of application No. PCT/JP2018/041673, filed on Nov. 9, 2018.

(30) Foreign Application Priority Data

Nov. 27, 2017  (JP) .............................. JP2017-227142

(51) Int. Cl.
*H03B 5/36* (2006.01)
*B81B 7/02* (2006.01)
(Continued)

(52) U.S. Cl.
CPC .................. *H03B 5/36* (2013.01); *B81B 7/02* (2013.01); *B81C 1/0023* (2013.01); *H03B 5/04* (2013.01);
(Continued)

(58) Field of Classification Search
CPC ....................................................... H03B 5/36
(Continued)

(56) References Cited

U.S. PATENT DOCUMENTS 7,442,570 B2  10/2008  Nasiri et al.
9,114,977 B2   8/2015  Daneman et al.
(Continued)

FOREIGN PATENT DOCUMENTS

| JP | 2001028516 A | 1/2001 |
|----|--------------|--------|
| JP | 2013129055 A | 7/2013 |
| WO | 2016158056 A1 | 10/2016 |

OTHER PUBLICATIONS

Written Opinion of the International Searching Authority issued for PCT/JP2018/041673, dated Jan. 29, 2019.
(Continued)

*Primary Examiner* — Joseph Chang
(74) *Attorney, Agent, or Firm* — Arent Fox LLP

(57) ABSTRACT

A resonator including a lower electrode, an upper electrode, and a piezoelectric film that is formed between the lower electrode and the upper electrode. A MEMS device is provided that includes an upper lid that faces the upper electrode, and a lower lid that faces the lower electrode and that seals the resonator together with the upper lid. A CMOS device is mounted on a surface of the upper lid or the lower lid opposite a surface that faces the resonator. The CMOS device includes a CMOS layer and a protective layer that is disposed on a surface of the CMOS layer opposite a surface that faces the resonator. The upper or lower lid to which the CMOS device is joined includes a through-electrode that electrically connects the CMOS device to the resonator.

20 Claims, 25 Drawing Sheets

(51) Int. Cl.
*B81C 1/00* (2006.01)
*H03B 5/04* (2006.01)
*H03H 3/007* (2006.01)
*H03H 3/02* (2006.01)
*H03H 9/02* (2006.01)
*H03H 9/17* (2006.01)
*H03H 9/15* (2006.01)

(52) U.S. Cl.
CPC ............ *H03H 3/0072* (2013.01); *H03H 3/02* (2013.01); *H03H 9/02448* (2013.01); *H03H 9/17* (2013.01); *B81B 2207/012* (2013.01); *B81B 2207/07* (2013.01); *H03H 2009/155* (2013.01)

(58) Field of Classification Search
USPC ...................................... 331/107 T
See application file for complete search history.

(56) References Cited

U.S. PATENT DOCUMENTS

| | | | |
|---|---|---|---|
| 2007/0224832 A1* | 9/2007 | Zurcher | ............. B81C 1/00253 438/758 |
| 2014/0145244 A1 | 5/2014 | Daneman et al. | |
| 2018/0048285 A1 | 2/2018 | Nishimura et al. | |

OTHER PUBLICATIONS

International Search Report issued for PCT/JP2018/041673, dated Jan. 29, 2019.

\* cited by examiner

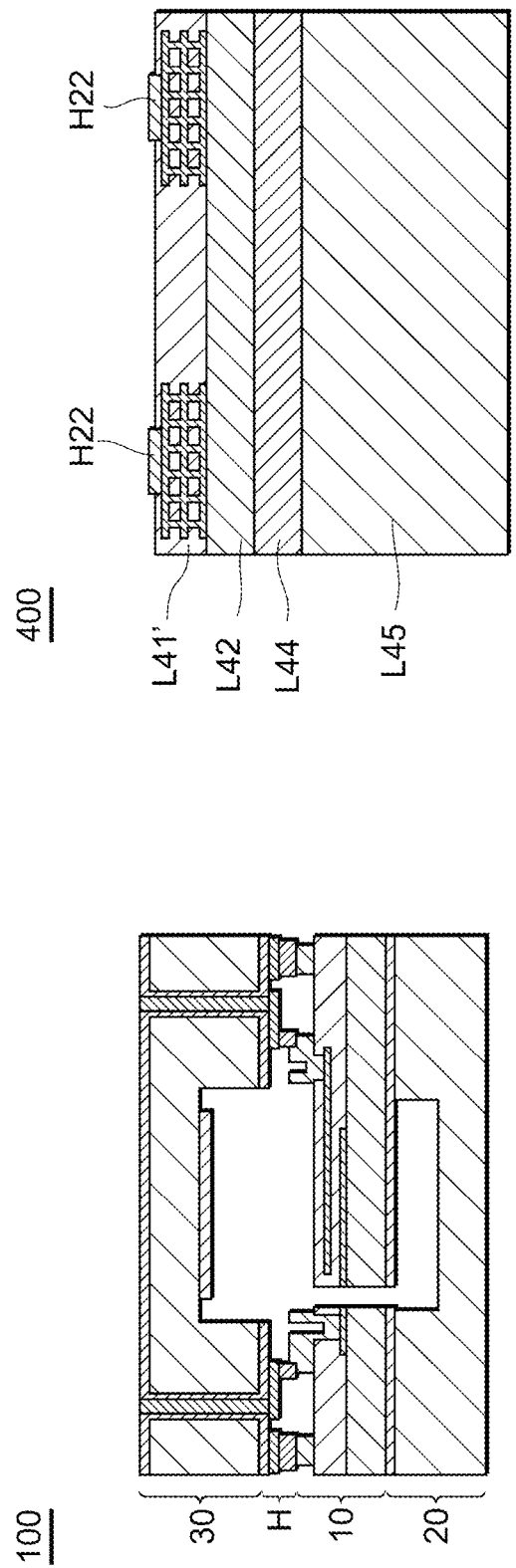

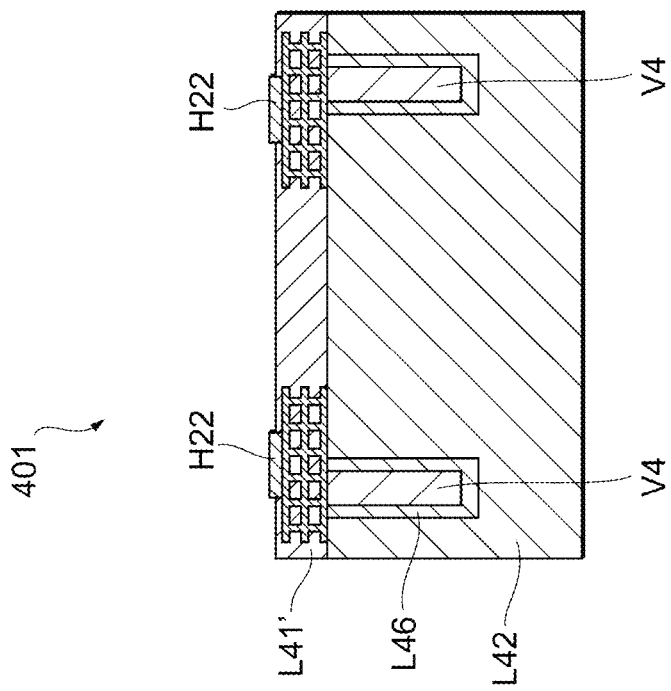
FIG. 12A
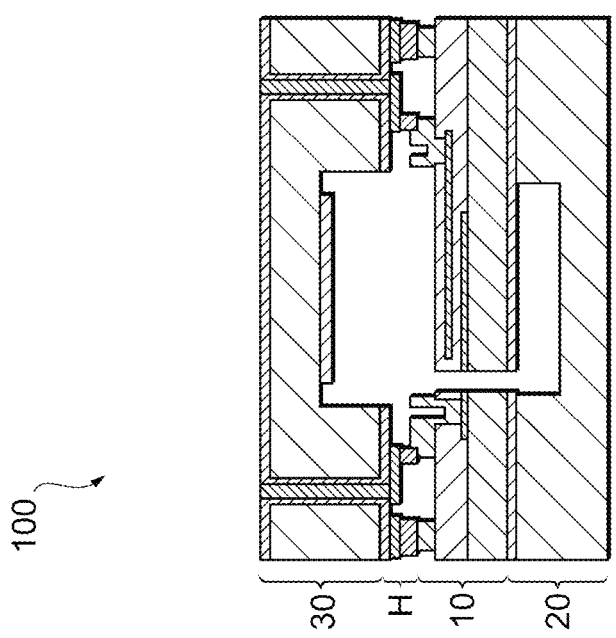

FIG. 13A
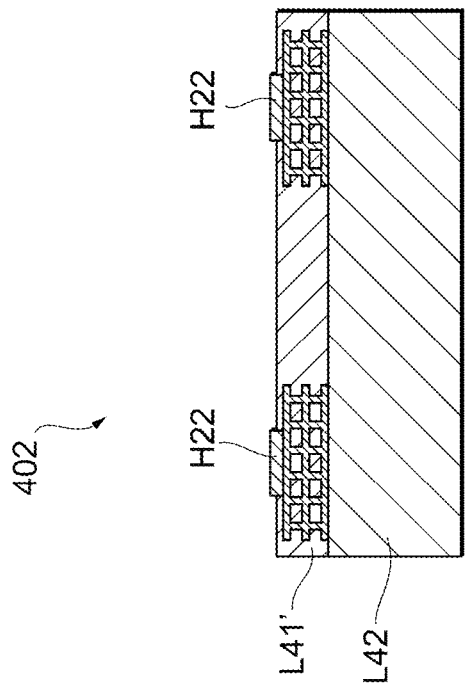
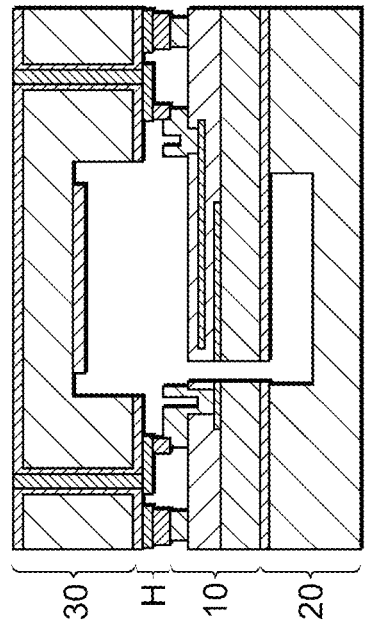

RESONANCE DEVICE

CROSS REFERENCE TO RELATED APPLICATIONS

The present application is a continuation of PCT/JP2018/041673 filed Nov. 9, 2018, which claims priority to Japanese Patent Application No. 2017-227142, filed Nov. 27, 2017, the entire contents of each of which are incorporated herein by reference.

TECHNICAL FIELD

The present invention relates to a resonance device.

BACKGROUND ART

Currently, existing piezoelectric resonance devices for which a MEMS (Micro Electro Mechanical Systems) technique is used, are used as timing devices, for example. Typically, the piezoelectric resonance device is mounted on a printed circuit board that is incorporated in an electronic device such as a smart phone.

The piezoelectric resonance device needs an oscillation circuit (for example, a CMOS device) for oscillating a resonator. However, a product in which the piezoelectric resonance device is mounted on the CMOS device has an increased height due to the CMOS device. Accordingly, a technique for mounting the piezoelectric resonance device on the CMOS device without increasing the height of the product is needed.

For example, Patent Documents 1 and 2 (identified below) disclose techniques for inhibiting the height of a product from increasing by substituting a CMOS device for a part of a package of a piezoelectric resonance device.

Patent Document 1: U.S. Pat. No. 7,442,570.
Patent Document 2: U.S. Pat. No. 9,114,977.

In the piezoelectric resonance device, a vibration space in which a resonator vibrates needs to be sealed in an airtight state by using a package and a vacuum state needs to be maintained to stabilize resonance characteristics. However, the CMOS device is not designed in consideration for outgassing. According to the existing techniques disclosed in Patent Documents 1 and 2, a circuit of the CMOS device is exposed, outgassing occurs depending on a material used for the circuit, and the degree of a vacuum in the vibration space decreases.

SUMMARY OF THE INVENTION

Accordingly, it is an object of the present invention to provide a resonance device that is configured to maintain a vacuum in a vibration space and without increasing the height of the product.

In an exemplary aspect, a resonance device is provided that includes a resonator that includes a lower electrode, an upper electrode, and a piezoelectric film that is formed between the lower electrode and the upper electrode, a MEMS device that includes an upper lid that faces the upper electrode of the resonator, and a lower lid that faces the lower electrode of the resonator and that seals the resonator together with the upper lid. Moreover, a CMOS device is mounted on a surface of the upper lid or the lower lid opposite a surface that faces the resonator. The CMOS device includes a CMOS layer and a protective layer that is disposed on a surface of the CMOS layer opposite a surface that faces the resonator. The upper lid or the lower lid to which the CMOS device is joined includes a through-electrode that electrically connects the CMOS device and the resonator to each other.

The exemplary embodiment of the present invention provides a resonance device that is configured to of maintain a vacuum in a vibration space without increasing the height of the product.

BRIEF DESCRIPTION OF DRAWINGS

FIG. 5A schematically illustrates a process flow of the resonance device according to the first exemplary embodiment.

FIG. 12A schematically illustrates a process flow of the resonance device according to the sixth exemplary embodiment.

FIG. 13A schematically illustrates a process flow of a resonance device according to a seventh exemplary embodiment.

DETAILED DESCRIPTION OF EMBODIMENTS

First Exemplary Embodiment

Figure 1:
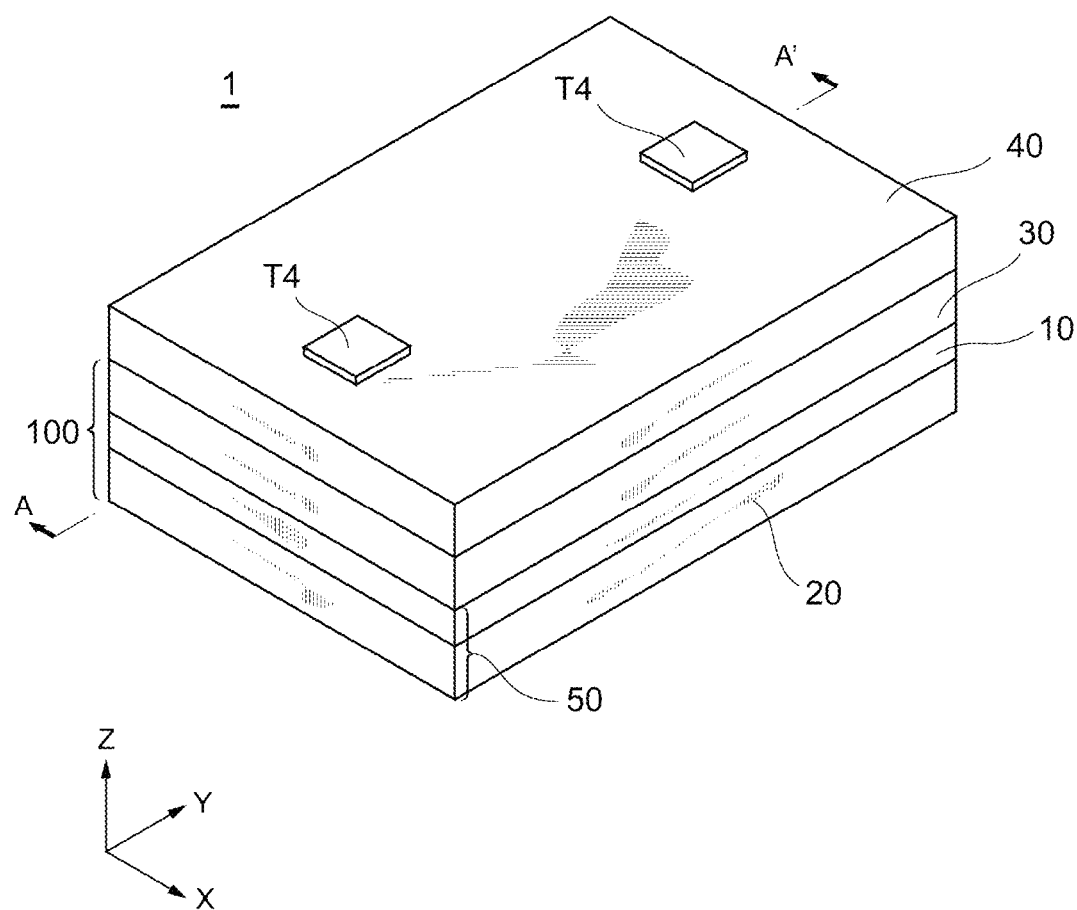
FIG. 1 schematically illustrates a perspective view of a resonance device according to a first exemplary embodiment.
Figure 2:
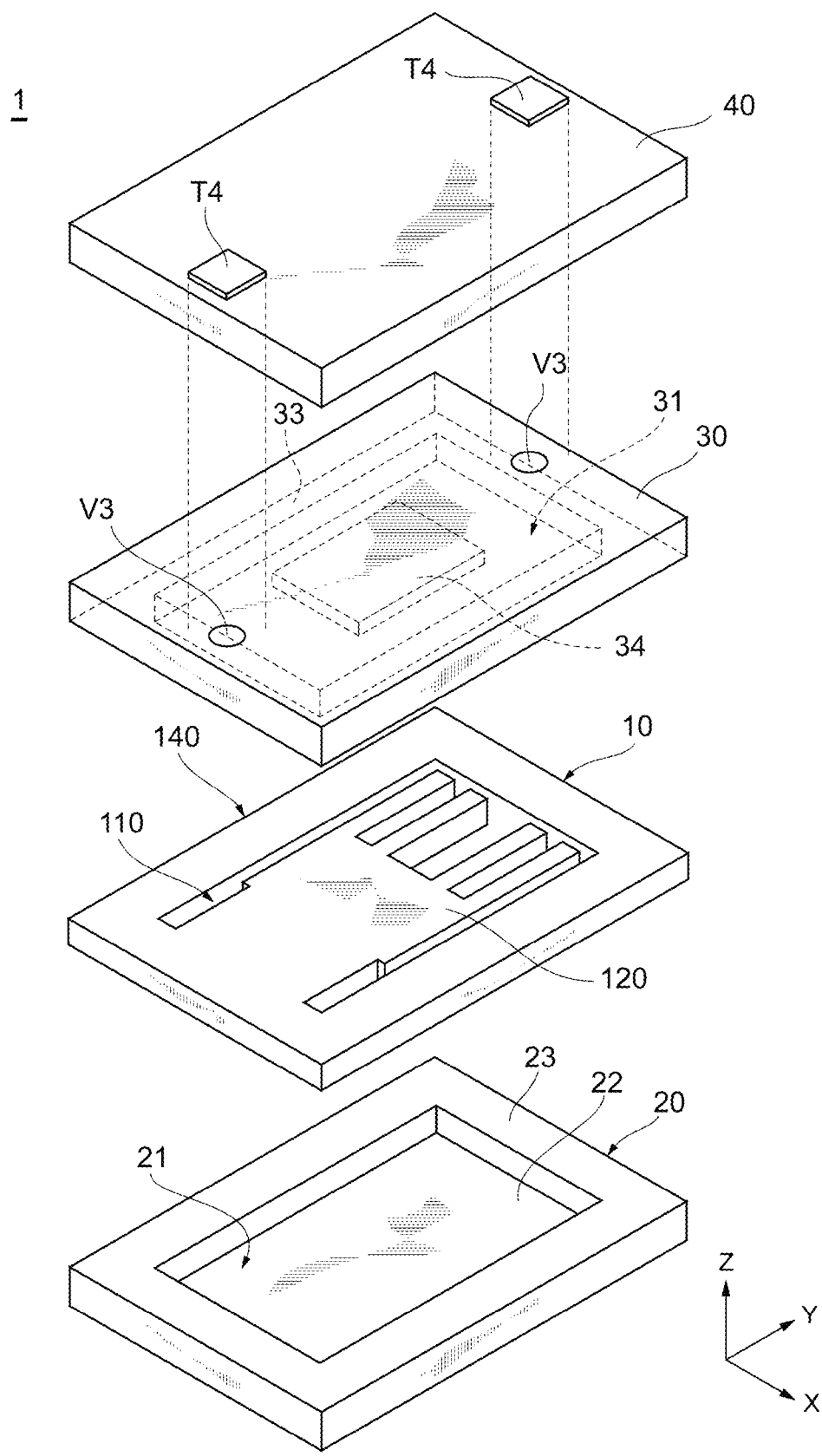
FIG. 2 schematically illustrates an exploded perspective view of the structure of the resonance device according to the first exemplary embodiment.

A first embodiment according to the present invention will be described below with reference to the drawings. FIG. 1 schematically illustrates a perspective view of a resonance device 1 according to the first embodiment of the present invention. FIG. 2 schematically illustrates an exploded perspective view of the structure of the resonance device 1 according to the first embodiment of the present invention.

As shown, the resonance device 1 includes a MEMS device 100 and a CMOS device 40 that are joined to each other. The MEMS device 100 includes a lower lid 20, a resonator 10 (a combination of the lower lid 20 and the resonator 10 is referred to below as a "MEMS substrate 50", for example), and an upper lid 30 that are stack in this order and joined to each other.

In an exemplary aspect, the resonator 10 is a MEMS vibrator that is manufactured by using a MEMS technique. The resonator 10 and the upper lid 30 are joined to each other, and a joint H1 described later is interposed therebetween. The resonator 10 and the lower lid 20 are formed by using Si substrates that are joined to each other. The resonator 10 is sealed by the upper lid 30, the lower lid 20, a hold member 140 (e.g., a frame) of the resonator 10 described later, and the joint H1 to form a vibration space in an airtight state. The MEMS substrate 50 (i.e., the resonator 10 and the lower lid 20) may be formed by using a SOI substrate in an exemplary aspect.

The structure of the resonance device 1 will now be described. In the following description, the upper lid 30 of the resonance device 1 is disposed on an upper side (or a front side), and the lower lid 20 is disposed on a lower side (or a back side).

Upper Lid 30

As shown, the upper lid 30 extends along a XY plane into a plate shape. On the back surface thereof, a recessed portion 31 in the form of, for example, a flat rectangular cuboid is formed. The recessed portion 31 is surrounded by a side wall 33 and forms a part of the vibration space in which the resonator 10 vibrates. Two through-electrodes V3 are formed in the upper lid 30. The upper lid 30 may not include the recessed portion 31 and may have a plate shape in another exemplary aspect. A getter layer 34 is formed on a surface of the recessed portion 31 of the upper lid 30 that faces the resonator 10.

Lower Lid 20

The lower lid 20 includes a bottom plate 22 that is disposed along the XY plane and that has a rectangular plate shape and a side wall 23 that extends in a Z-axis direction (that is, a direction in which the lower lid 20 and the resonator 10 are stacked) from a circumferential portion of the bottom plate 22. A recessed portion 21 is formed on a surface of the lower lid 20 that faces the resonator 10 by a front surface of the bottom plate 22 and the inner surface of the side wall 23. The recessed portion 21 forms a part of the vibration space of the resonator 10. The vibration space is sealed in an airtight state by the above upper lid 30, the lower lid 20, the hold member 140, and the joint H1, and a vacuum state is maintained. In an exemplary aspect, the vibration space may be filled with gas such as inert gas. The lower lid 20 may not include the recessed portion 21 and may have a plate shape. A getter layer may be formed on a surface of the recessed portion 21 of the lower lid 20 that faces the resonator 10.

Resonator 10

Figure 3:
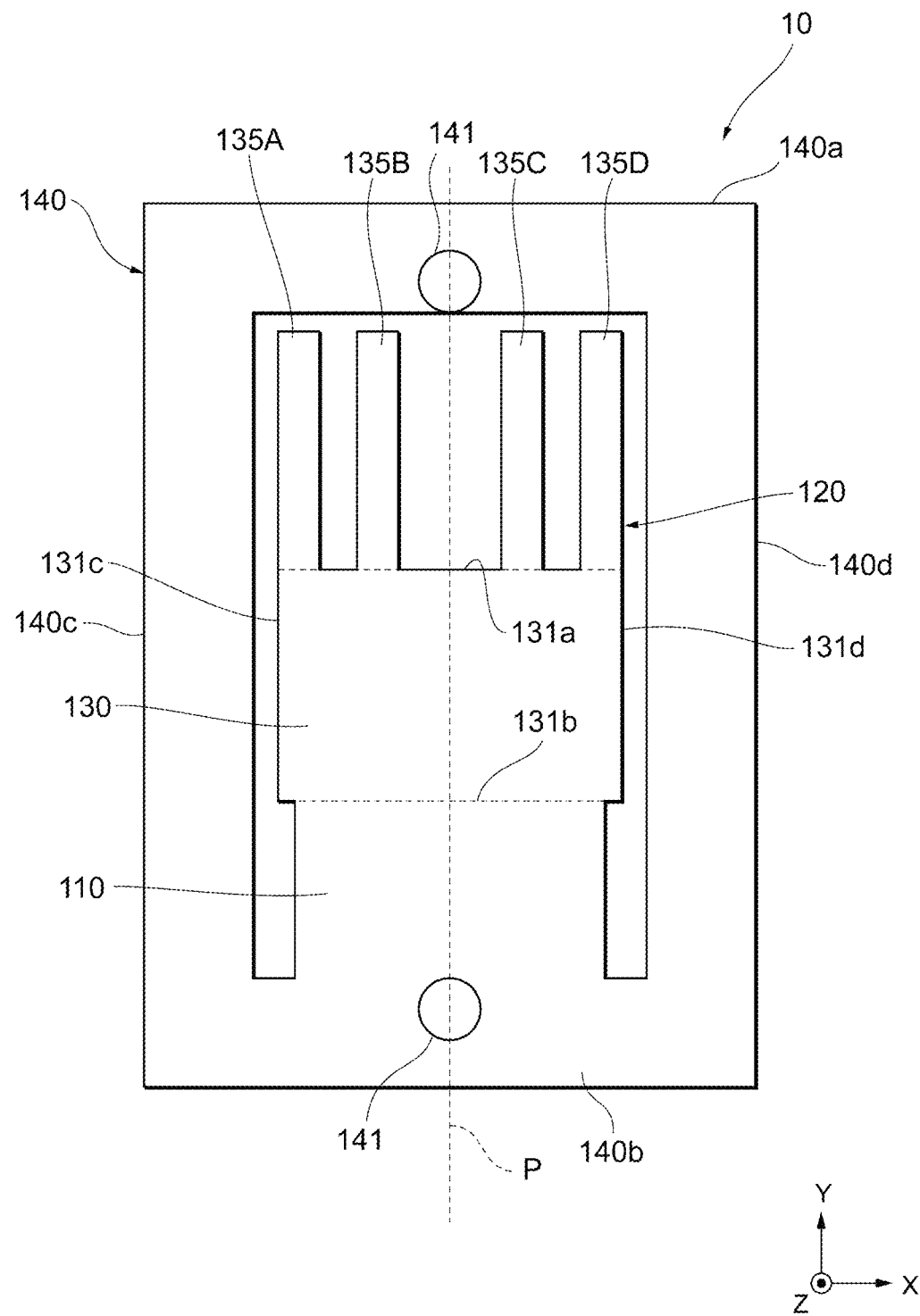
FIG. 3 is a plan view of a resonator according to the first exemplary embodiment.

FIG. 3 schematically illustrates a plan view of the structure of the resonator 10 according to the present embodiment. The resonator 10 is a MEMS vibrator that is manufactured by using a MEMS technique, and out-of-plane vibration thereof occurs in the XY plane of a rectangular coordinate system in FIG. 3. It is noted that the resonator 10 is not limited to a resonator that operates in an out-of-plane bending vibration mode illustrated in FIG. 3 and may operate in a broadened vibration mode, a thickness longitudinal vibration mode, a lamb wave vibration mode, an in-plane bending vibration mode, or a surface acoustic wave vibration mode. These configurations are used for a timing device, a RF filter, a duplexer, an ultrasonic transducer, a gyro-sensor, or an acceleration sensor, for example. These configurations may also be used for a piezoelectric mirror or a piezoelectric gyro-sensor that has an actuator function or a piezoelectric microphone or an ultrasonic vibration sensor that has a pressure sensor function. Yet further, these configurations may also be used for an electrostatic MEMS element, an electromagnetic driving MEMS element, or a piezoelectric resistance MEMS element.

The resonator 10 includes a vibration member 120, the hold member 140, and a hold arm 110.

The vibration member 120 is disposed inside the hold member 140 (i.e., a frame). A space having a predetermined length is formed between the vibration member 120 and the hold member 140. In an example in FIG. 3, the vibration member 120 includes a base 130 and four vibration arms 135A to 135D (also referred to as a "vibration arm 135" as a whole). However, it is noted that the number of the vibration arms is not limited to 4 but is set to, for example, a freely selected number of 1 or more. According to the present embodiment, the vibration arm 135 and the base 130 are integrally formed.

The base 130 has long sides 131a and 131b in an X-axis direction and short sides 131c and 131d in a Y-axis direction in a plan view. The long side 131a is a side of a front edge surface 131A (also referred to below as a "front edge 131A") of the base 130. The long side 131b is a side of a rear edge surface 131B (also referred to below as a "rear edge 131B") of the base 130. The front edge 131A and the rear edge 131B of the base 130 face each other.

The base 130 is connected to the vibration arm 135 described later along the front edge 131A and is connected to the hold arm 110 described later along the rear edge 131B. As shown in an example in FIG. 4, the base 130 has a substantially rectangular shape in a plan view but is not limited thereto, provided that the base 130 is substantially plane-symmetrical to an imaginary plane P that is defined as being along the perpendicular bisector of the long side 131a. For example, the base 130 may have a trapezoidal shape in which the long side 131b is shorter than the long side 131a or a semicircular shape a diameter of which coincides with the long side 131a. The surfaces of the base 130 are not limited to a flat surface and may be curved. The imaginary plane P passes through the center of the vibration member 120 in the direction of arrangement of the vibration arm 135.

A base length of the base 130 that is the maximum length between the front edge 131A and the rear edge 131B in the direction from the front edge 131A toward the rear edge 131B is about 35 µm, for example. Moreover, a base width that is the maximum length between the side edges of the base 130 in the width direction perpendicular to the direction of the base length is about 265 µm, for example.

The vibration arm 135 (i.e., arms 135A-135D) extends in the Y-axis direction and has the same size. The vibration arm 135 is arranged in the Y-axis direction between the base 130 and the hold member 140. An end thereof is connected to the front edge 131A of the base 130 and is stationary end, and the other end is an open end. The vibration arm 135 is arranged in parallel at predetermined intervals in the X-axis direction. For example, the width of the vibration arm 135 in the X-axis direction is about 50 µm, and the length thereof in the Y-axis direction is about 465 µm, for example.

The hold member 140 is formed into a rectangular frame shape so as to surround the vibration member 120 along the XY plane. For example, the hold member 140 is integrally formed from a prismatic frame shape. It is noted that the hold member 140 only needs to be disposed around at least a part of the vibration member 120 and is not limited to the frame shape.

Moreover, voltage applicators 141 are formed in a region of the hold member 140 that faces the open end of the vibration arm 135 and a region connected to the hold arm. The voltage applicators 141 are connected to an external power supply and can apply an alternating electric field to the resonator 10.

The hold arm 110 is disposed inside the hold member 140 and connects the vibration member 120 to the hold member 140.

CMOS Device 40

According to the exemplary aspect, the CMOS device 40 is a CMOS wafer for an oscillation circuit that is formed by using a SOI wafer, extends along the XY plane in FIG. 2 into a plate shape, and includes terminals T4 (e.g., a pair of terminals T4). As further shown, the CMOS device 40 is mounted on a surface of the upper lid 30 opposite a surface that faces the resonator 10.

The terminals T4 are formed on a front surface of the CMOS device and face the through-electrodes V3 of the upper lid 30. The terminals T4 are electrically connected to the voltage applicators 141 on the hold member 140 when eutectic coupling occurs between the upper lid 30 and the resonator 10 due to a joint H2 described later.

Multilayer Structure

Figure 4:
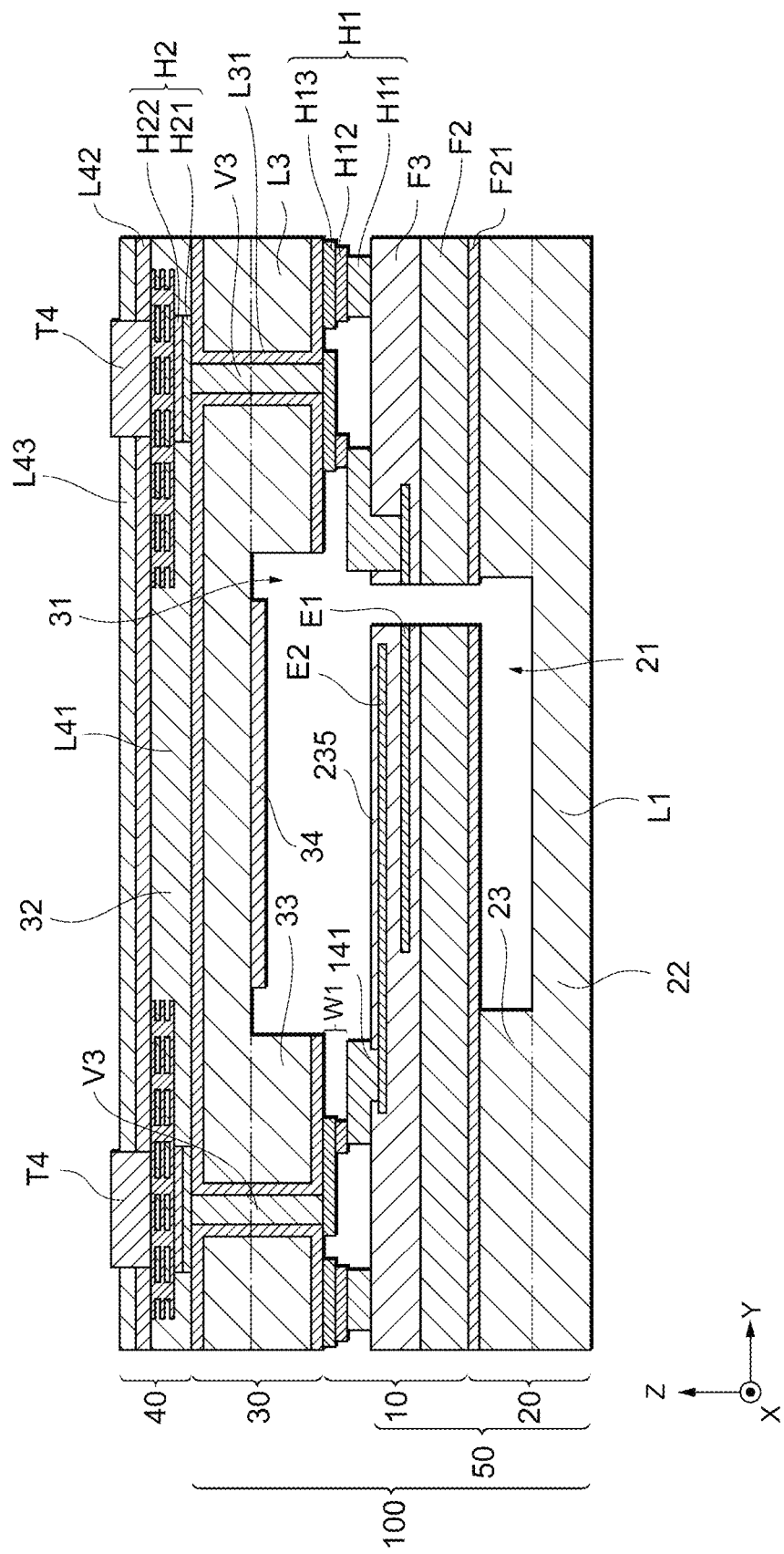
FIG. 4 is a sectional view of FIG. 1 taken along line AA'.

The multilayer structure of the resonance device 1 will be described with reference to FIG. 4. FIG. 4 is a sectional view of FIG. 1 taken along line AA'. In the resonance device 1 according to the present embodiment, as illustrated in FIG. 4, the hold member 140 of the resonator 10 is joined to the side wall 23 of the lower lid 20, and the hold member 140 of the resonator 10 and the side wall 33 of the upper lid 30 are joined to each other. The resonator 10 is thus held between the lower lid 20 and the upper lid 30. The vibration space in which the vibration arm 135 vibrates is formed by the lower lid 20, the upper lid 30, and the hold member 140 of the resonator 10.

2-1. Upper Lid 30

The upper lid 30 is formed by using a Si (silicon) wafer L3 having a predetermined thickness according to an exemplary aspect. As illustrated in FIG. 4, the upper lid 30 is joined to the hold member 140 of the resonator 10 at the joint H1 described later along a circumferential portion (e.g., the side wall 33) thereof. The front surface and the back surface of the upper lid 30 that faces the resonator 10 and side surfaces of the through-electrodes V3 are preferably covered by a silicon oxide film L31. The silicon oxide film L31 is formed on a front surface of a Si wafer L3 by, for example, oxidation of the front surface of the Si wafer L3 or chemical vapor deposition (CVD).

The getter layer 34 is formed on the surface of the recessed portion 31 of the upper lid 30 that faces the resonator 10. The getter layer 34 is composed of, for example, Ti (titanium) and absorbs a gas outgassing in the vibration space that is defined by the upper lid 30 and the lower lid 20. According to the present embodiment, the getter layer 34 is formed on the entire surface of the recessed portion 31 of the upper lid 30 that faces the resonator 10 and can sufficiently absorb the outgassing gas, and a vacuum in the vibration space can be maintained.

The through-electrodes V3 of the upper lid 30 are formed by filling through-holes that are formed in the upper lid 30 with metal such as polycrystalline silicon (Poly-Si). The through-electrodes V3 function as wiring lines that electrically connect the terminals T4 and the voltage applicators 141 to each other. For example, Al films or Ge films are formed between the through-electrodes V3 and the voltage applicators 141.

2-2. MEMS Substrate: Lower Lid 20

The bottom plate 22 and the side wall 23 of the lower lid 20 are integrally formed by using a Si (silicon) wafer L1. The lower lid 20 is joined to the hold member 140 of the resonator 10 along the upper surface of the side wall 23. The thickness of the lower lid 20 in the Z-axis direction is, for example, 150 µm. The depth of the recessed portion 21 is, for example, 50 µm. The Si wafer L1 is composed of silicon that is not degenerate, and the resistivity thereof is, for example, 16 mΩ·cm or more.

2-3. MEMS Substrate: Resonator 10

The hold member 140, the base 130, the vibration arm 135, and the hold arm 110 of the resonator 10 are integrally formed in the same process. In the resonator 10, a metal layer E1 is stacked on a Si (silicon) substrate F2 (that is an example of the substrate). A piezoelectric thin film F3 is stacked on the metal layer E1 so as to cover the metal layer E1. A metal layer E2 is stacked on the piezoelectric thin film F3. A protection film 235 is stacked on the metal layer E2 so as to cover the metal layer E2.

The Si substrate F2 is composed of, for example, degenerate n-type Si semiconductor having a thickness of about 6 µm and can contain a n-type dopant such as P (phosphorus), As (arsenic), or Sb (antimony). The resistance value of degenerate Si that is used for the Si substrate F2 is, for example, less than 16 mΩ·cm, preferably 1.2 mΩ·cm or less. A silicon oxide (for example, $SiO_2$) layer F21 (that is an example of a layer for compensating temperature characteristics) is formed on the lower surface of the Si substrate F2. This configuration improves the temperature characteristics. The silicon oxide layer F21 may be formed on the upper surface of the Si substrate F2 or the silicon oxide layers F21 may be formed on the upper surface and the lower surface of the Si substrate F2.

The metal layers E2 and E1 are composed of, for example, Mo (molybdenum) or aluminum (Al) having a thickness of no less than 0.1 μm and no more than 0.2 μm.

The metal layers E2 and E1 are formed into a desired shape by, for example, etching. The metal layer E1, for example, on the vibration member 120 functions as a lower electrode. The metal layer E1 on the hold arm 110 or the hold member 140 functions as a wiring line that connects the lower electrode to an AC power supply that is disposed outside the resonator 10.

The metal layer E2 on the vibration member 120 functions as an upper electrode. The metal layer E2 on the hold arm 110 or the hold member 140 functions as a wiring line that connects the upper electrode to a circuit that is disposed outside of the resonator 10.

In an exemplary aspect, the protection film 235 is composed of a nitride film such as an AlN film or a SiN film or an oxide film such as a $Ta_2O_5$ (tantalum pentoxide) film or a $SiO_2$ film. Moreover, the protection film 235 are removed such that the metal layer E2 is exposed from the hold member 140. Metal such as Al is filled at locations at which the protection film 235 is removed to form the voltage applicators 141.

The terminals T4 that are formed on the outer surface of the CMOS device 40 and the voltage applicators 141 are connected to each other with connection wiring lines W1 interposed therebetween, and the connection wiring lines W1 are connected to the through-electrodes V3 that are formed in the upper lid 30. The connection wiring lines W1 are formed by, for example, eutectic coupling of Al and Ge.

The piezoelectric thin film F3 converts an applied voltage into vibration, and the main component thereof can be, for example, nitride such as AlN (nitride aluminum) or an oxide. Specifically, the piezoelectric thin film F3 can be composed of ScAlN (scandium aluminum nitride). ScAlN is obtained by replacing a part of aluminum in nitride aluminum with scandium. The piezoelectric thin film F3 has a thickness of, for example, 1 μm and can have a thickness of about 0.2 μm to 2 μm.

The piezoelectric thin film F3 expands and contracts in the in-plane direction of the XY plane, that is, the Y-axis direction depending on an electric field that is applied to the piezoelectric thin film F3 by the metal layers E2 and E1. The expansion and contraction of the piezoelectric thin film F3 causes the vibration arm 135 to change the position of the free end thereof toward the inner surface of the upper lid 30 and the lower lid 20 and to vibrate in the out-of-plane bending vibration mode.

According to the present embodiment, the phase of an electric field that is applied to the vibration arms 135A and 135D on the outside is opposite the phase of an electric field that is applied to the vibration arms 135B and 135C on the inside. Consequently, the vibration arms 135A and 135D on the outside and the vibration arms 135B and 135C on the inside shift in opposite directions. For example, when the free ends of the vibration arms 135A and 135D on the outside shift toward the inner surface of the upper lid 30, the free ends of the vibration arms 135B and 135C on the inside shift toward the inner surface of the lower lid 20.

2-4. CMOS Device 40

As further shown, the CMOS device 40 includes a CMOS layer L42, a protective layer L43, a wiring layer L41, and the terminals T4.

The thickness of the CMOS layer L42 is, for example, no less than 1 μm and no more than 100 μm. In the CMOS layer L42, for example, a CMOS circuit for oscillation or a re-wiring line are formed on a substrate composed of, for example, Si. A CMOS circuit for an oscillation circuit is electrically connected to the external power supply with the terminals T4 interposed therebetween.

The protective layer L43 is a passivation film and is composed of, for example, an organic resin such as polybenzoxazole, polyimide, a silicon nitride film, or a silicon oxide film having a thickness of no less than 0.1 μm and no more than 10 μm. The protective layer L43 is formed so as to cover the surface (i.e., the upper surface) of the CMOS layer L42 opposite the surface that faces the resonator and protects the front surface of the resonance device 1.

The terminals T4 electrically connect the external power supply or signal and the resonator 10 to each other. The terminals T4 are formed by removing the protective layer L43 and the CMOS layer L42 by, for example, etching to form through-holes and filling the formed through-holes with metal such as Al.

The wiring layer L41 is disposed between the MEMS device 100 and the CMOS device 40. The wiring layer L41 is a multilayer of an insulating film and a wiring line and is composed of, for example, an oxide of $SiO_2$ (silicon dioxide), SiN (silicon nitride), polyimide, polybenzoxazole, or BCB (Benzocyclobutene) having a thickness of no less than 0.1 μm and no more than 10 μm. The wiring layer L41 is formed so as to cover the surface (also referred to below as the lower surface) of the CMOS layer L42 that faces the resonator 10 and protects the CMOS circuit for oscillation that is formed in the CMOS layer L42.

2-5. Additional Structures

The joint H1 is formed into an annular rectangle shape along the XY plane between the resonator 10 and the upper lid 30. The joint H1 causes eutectic coupling between the resonator 10 and the upper lid 30 and seals the vibration space of the resonator 10. According to the present embodiment, the joint H1 is formed by stacking an Al layer H11, a Ge layer H12, and an Al layer H13 in this order. The use of the same kind of metal as the connection wiring lines W1 for the joint H1 makes a process simple. In FIG. 4, the Al layer H11, the Ge layer H12, and the Al layer H13 are separated layers. However, eutectic coupling actually occurs between the interfaces thereof. The joint H1 may be composed of, for example, an Au (gold) film and a Sn (tin) film.

The joint H2 is formed between the upper lid 30 and the CMOS device 40 and causes eutectic bonding between the upper lid 30 and the CMOS device 40. According to the present embodiment, the joint H2 is formed by stacking a Ge layer H21 and an Al layer H22 in this order. In FIG. 4, the Ge layer H21 and the Al layer H22 are separated layers. However, eutectic coupling actually occurs between the interfaces thereof.

The CMOS device 40 of the resonance device 1 according to the present embodiment thus includes no handling layer. This enables the CMOS device 40 to be thin and enables the thickness of the resonance device 1 to be decreased.

In the resonance device 1 according to the present embodiment, the CMOS device 40 is connected outside the MEMS device. This enables a high degree of vacuum in the vibration space of the MEMS device to be stably obtained even when the material of the CMOS circuit of the CMOS device 40 causes outgassing.

Process Flow

A process of manufacturing the resonance device 1 according to the present embodiment will now be described with reference to FIG. 5A to FIG. 5H. FIG. 5A to FIG. 5H illustrate some processes for joining the upper lid 30 and the CMOS device 40 to each other in the process flow of the resonance device 1. It is noted that a description of components of the resonance device 1 other than the upper lid 30 and the CMOS device 40 are omitted for convenience of the description. In FIG. 5A to FIG. 5H, the single resonance device 1 of the multiple resonance devices 1 that are formed on a wafer is illustrated for convenience. However, the multiple resonance devices 1 are typically formed on the single wafer as in a normal MEMS process, and the resonance device 1 is subsequently obtained by dividing the wafer as should be appreciated to one skilled in the art.

In a process firstly illustrated in FIG. 5A, the MEMS device 100 and a CMOS wafer 400 are prepared. The CMOS wafer 400 is formed by stacking a handling Si layer L45, a BOX (Buried Oxide: buried oxide film) layer L44 (the handling Si layer L45 and the BOX layer L44 are also referred to below as a "support layer" as a whole), a CMOS layer L42, and an insulating film L41' in this order. The handling Si layer L45, the BOX layer L44, and the CMOS layer L42 are formed by using an existing CMOS formation process. The CMOS circuit for oscillation is formed in the CMOS layer L42, and the insulating film L41' is subsequently formed so as to cover the CMOS circuit for oscillation. The insulating film L41' is composed of the same material as the above wiring layer L41.

The insulating film L41' is partly removed. The Al film H22 that is electrically connected to the CMOS circuit for oscillation is formed at the removed location. At this time, the Al film H22 is formed apart from the insulating film L41'. Consequently, the insulating film L41' functions as a stopper during a subsequent heating process and enables the mechanical strength of the CMOS device 40 to be ensured also after the CMOS device 40 is transferred to the MEMS device 100.

Figure 5B:
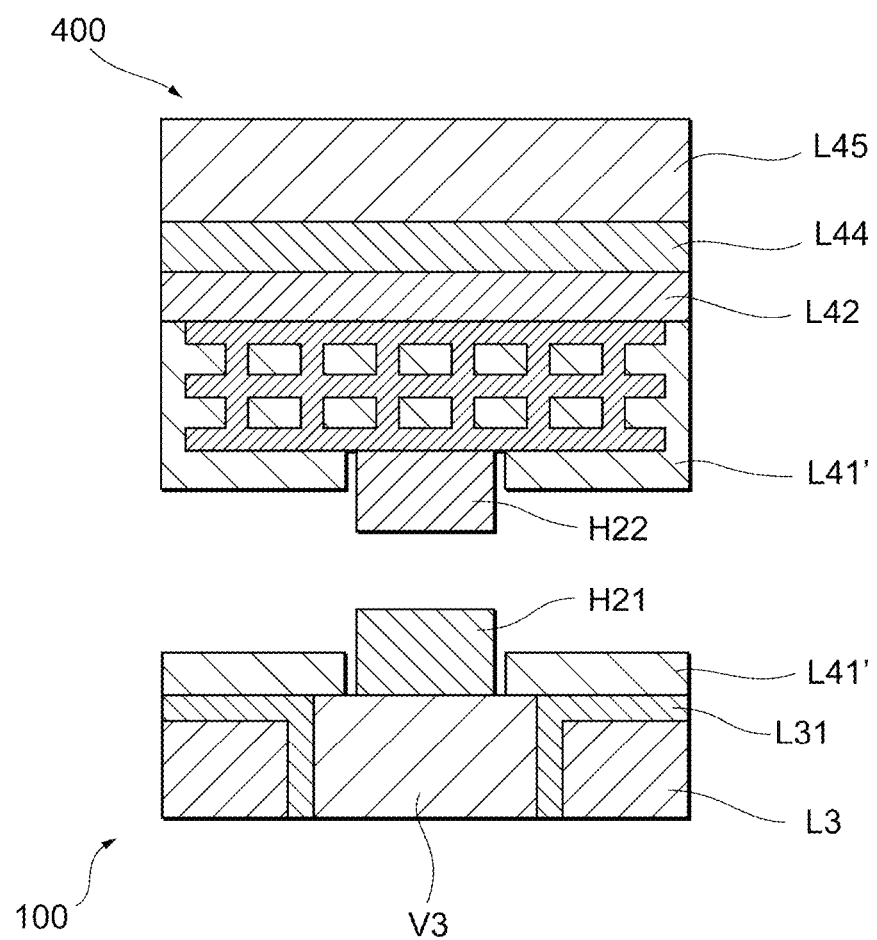
FIG. 5B schematically illustrates the process flow of the resonance device according to the first exemplary embodiment.

Subsequently, in a process in FIG. 5B, the insulating film L41' is formed on the front surface of the upper lid 30 of the MEMS device 100. An oxide film L34 on the through-electrodes V3 is partly removed such that the metal filled in the through-electrodes V3 is exposed. A Ge film H21 is formed at the location at which the oxide film L34 is removed. The Ge film H21 is formed apart from the insulating film L41' as in the Al film H22.

The positions of the MEMS device 100 and the CMOS wafer 400 are adjusted such that the center of the Ge film H21 and the center of the Al film H22 are coincide with each other. The positions of the MEMS device 100 and the CMOS wafer 400 are adjusted, for example, in a manner in which a wafer for forming the upper lid 30 and a wafer for forming the CMOS wafer 400 are marked, and the positions of the wafers are directly adjusted, or in a manner in which the positions of the wafers are indirectly adjusted on the basis of the position of, for example, the upper lid 30 that is formed on the wafer.

Figure 5C:
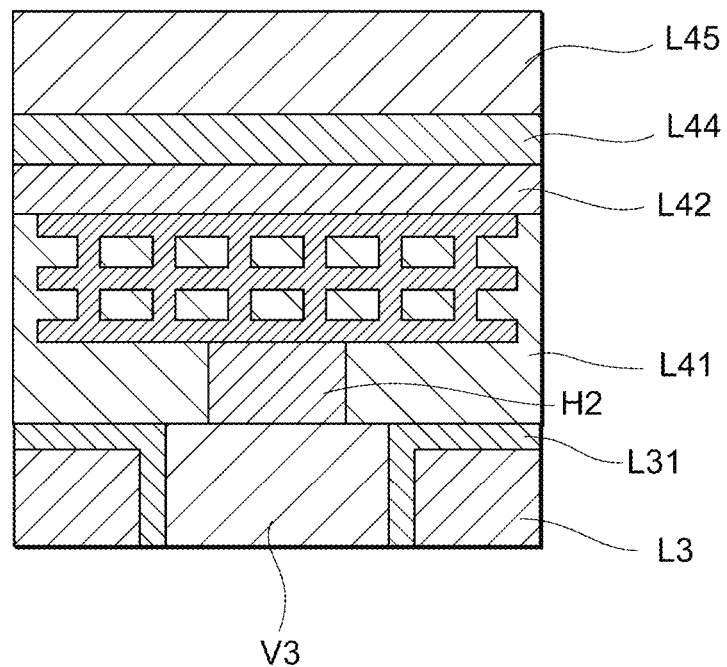
FIG. 5C schematically illustrates the process flow of the resonance device according to the first exemplary embodiment.

After the positions are adjusted, the MEMS device 100 and the CMOS wafer 400 are nipped by, for example, a heater, and pressing and heating processes are performed (FIG. 5C). At this time, the CMOS wafer 400 is moved toward the MEMS device 100. Consequently, the center of the Al film H22 and the center of the Ge film H21 coincide with each other and are in contact with each other.

According to an exemplary aspect, the temperature in the heating process is, for example, no less than 400° C. and no more than 500° C., and a heating time is preferably no less than 5 minutes and no more than 60 minutes. During heating, for example, a pressure of no less than 5 Mpa and no more than 20 Mpa is applied from the CMOS wafer 400 to the MEMS device 100. Consequently, eutectic coupling occurs between the Al film H22 and the Ge film H21, and the joint H2 is formed. At this time, the insulating film L41' of the CMOS wafer 400 and the insulating film L41' of the MEMS device 100 are crushed, and the wiring layer L41 is formed. The wiring layer L41 enables the mechanical strength of the CMOS device 40 to be ensured after the CMOS device 40 is transferred to the MEMS device 100.

Figure 5D:
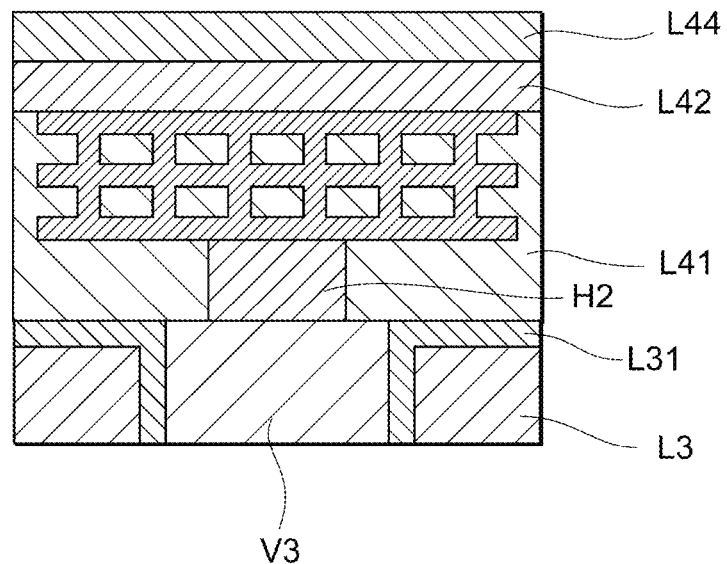
FIG. 5D schematically illustrates the process flow of the resonance device according to the first exemplary embodiment.
Figure 5E:
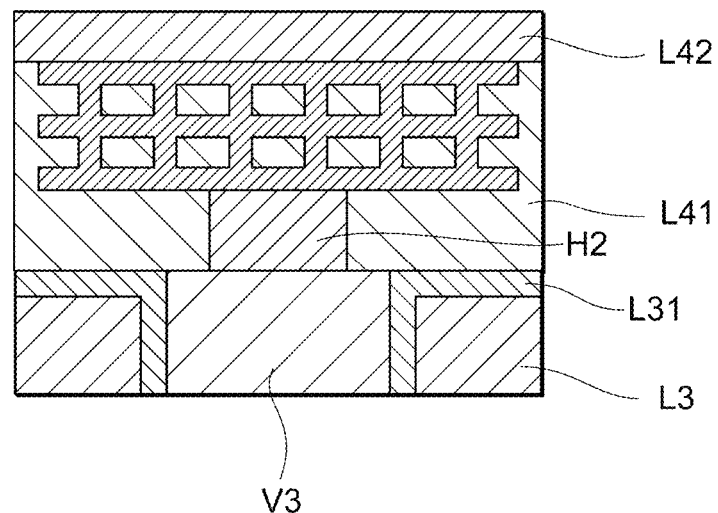
FIG. 5E schematically illustrates the process flow of the resonance device according to the first exemplary embodiment.

Subsequently, the handling Si layer L45 and the BOX layer L44 are sequentially removed, and the upper surface of the CMOS layer L42 is exposed (FIG. 5D and FIG. 5E).

Figure 5F:
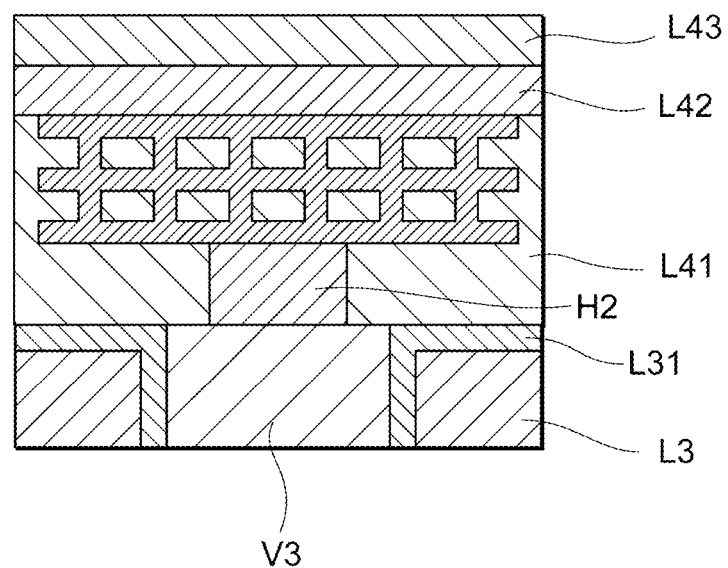
FIG. 5F schematically illustrates the process flow of the resonance device according to the first exemplary embodiment.
Figure 5G:
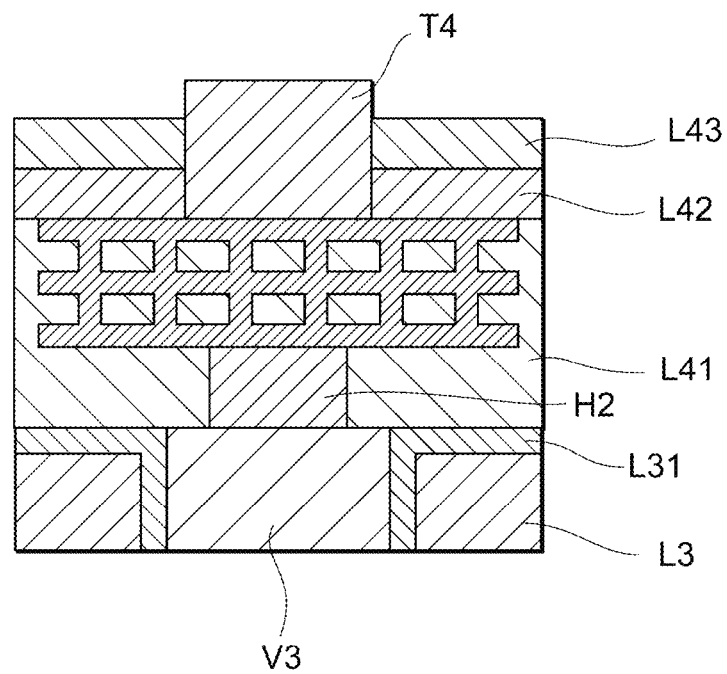
FIG. 5G schematically illustrates the process flow of the resonance device according to the first exemplary embodiment.
Figure 5H:
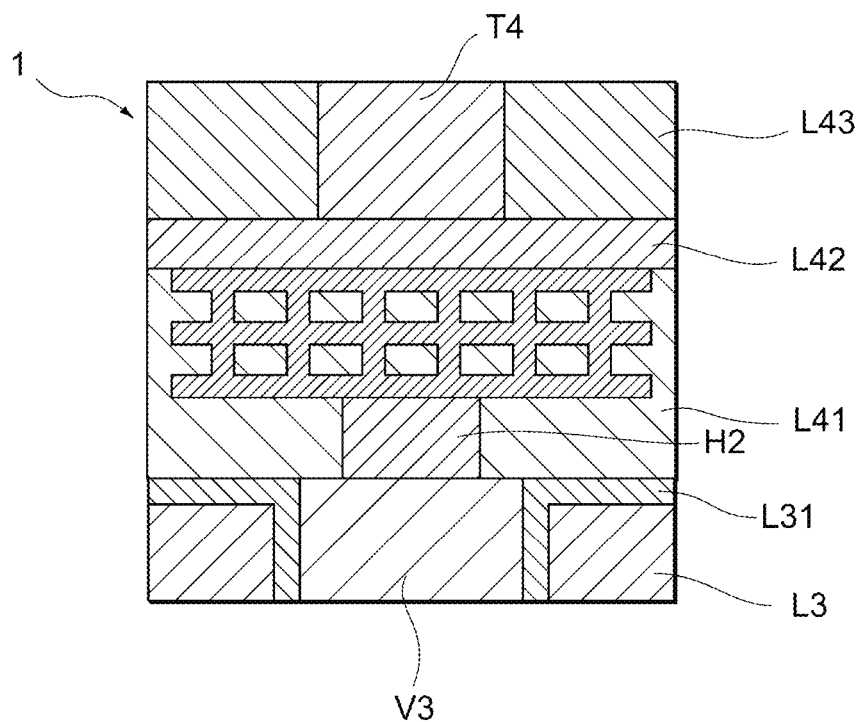
FIG. 5H schematically illustrates the process flow of the resonance device according to the first exemplary embodiment.

Subsequently, the protective layer L43 is formed on the upper surface of the CMOS layer L42 (FIG. 5F). In a subsequent process illustrated in FIG. 5G, the protective layer L43 and the CMOS layer L42 are removed, through-holes are formed, and the terminals T4 are formed in the formed through-holes. The protective layer L43 is stacked again so as to cover the side surfaces of the terminals T4 (FIG. 5H). Subsequently, the resonance device 1 that is divided with a dicing machine is obtained.

The CMOS device 40 of the resonance device 1 according to the present embodiment thus includes no handling Si. This configuration enables the thickness of the resonance device 1 to be decreased. The CMOS device 40 is formed outside the package (that is, the upper lid 30) of the MEMS device 100. Consequently, the vacuum in the vibration space of the MEMS device 100 can be maintained even when a material that causes outgassing is selected for the circuit that is formed on the CMOS device 40.

Second Exemplary Embodiment

According to a second embodiment and later, a description of matters common to those according to the first embodiment is omitted, and only different matters will be described. In particular, the same effects achieved by the same structures are not described for every embodiment.

Figure 6A:
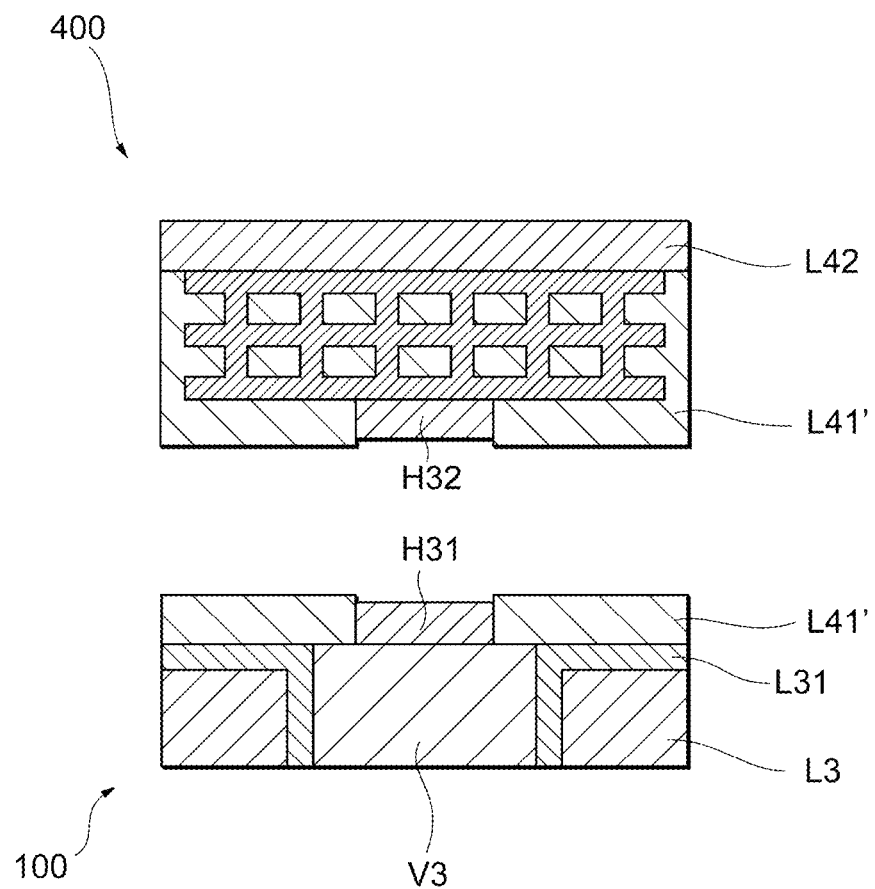
FIG. 6A schematically illustrates a process flow of a resonance device according to a second exemplary embodiment.
Figure 6B:
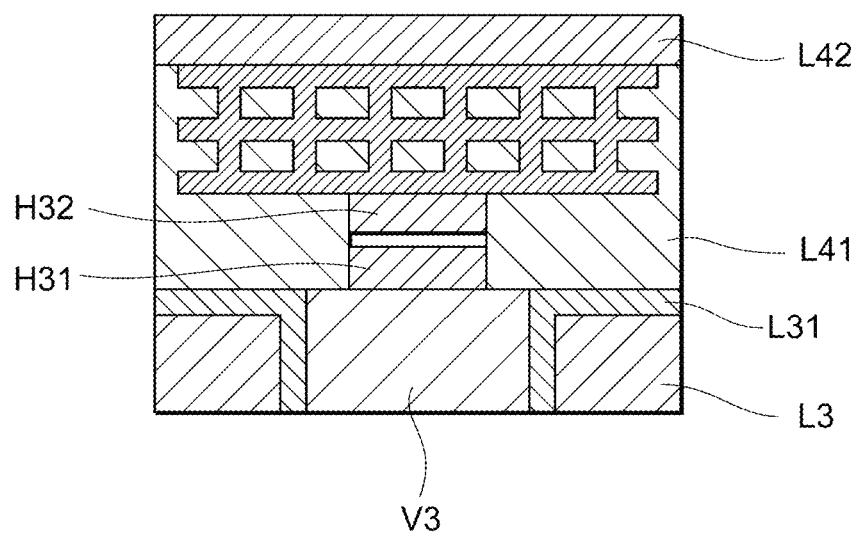
FIG. 6B schematically illustrates the process flow of the resonance device according to the second exemplary embodiment.
Figure 6C:
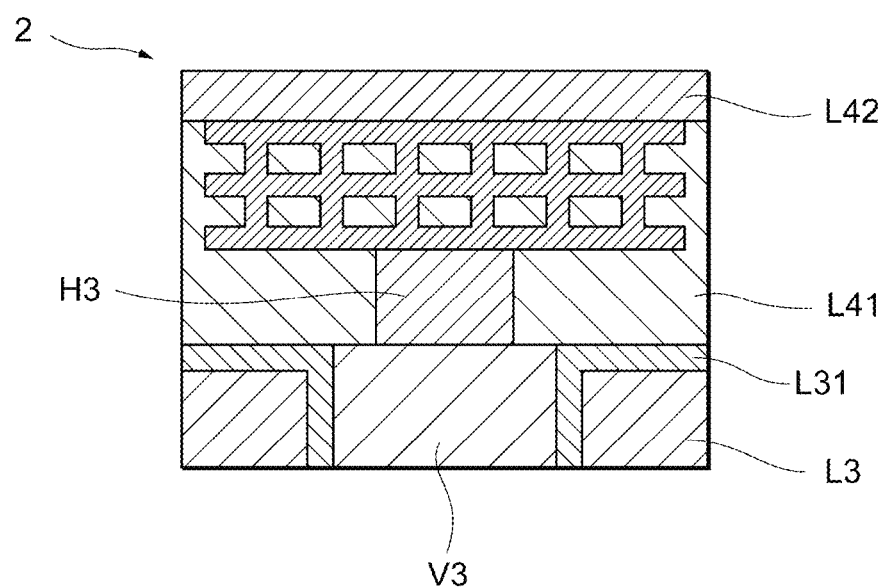
FIG. 6C schematically illustrates the process flow of the resonance device according to the second exemplary embodiment.

FIG. 6A to FIG. 6C illustrate the process flow of a resonance device 2 according to the present embodiment. The resonance device 2 according to the present embodiment includes a joint H3 instead of the joint H2 of the resonance device 1 according to the first embodiment. The joint H3 is formed by activation bonding of insulating layers. The detailed structure of the resonance device 2 according to the present embodiment, mainly differences from the first embodiment, will now be described.

In the process flow according to the second embodiment, a Cu (copper) film H32 is formed on the CMOS wafer 400 instead of the Al film H22. The Cu film H32 is formed by, for example, a damascene process. A Cu film H31 is formed on the MEMS device 100 instead of the Ge film H21 (FIG. 6A). At this time, the Cu film H32 and the Cu film H31 are formed by, for example, dishing so as to be thinner than each insulating film L41'. The positions of the MEMS device 100 and the CMOS wafer 400 are adjusted such that the center of the Cu film H31 and the center of the Cu film H32 coincide with each other.

After the positions are adjusted, the MEMS device 100 and the CMOS wafer 400 are brought into contact with each other by the insulating films L41', and the insulating films L41' are joined to each other by plasma activation bonding (FIG. 6B). The plasma activation bonding is a method of removing attached substances such as moisture and carbon on bonding surfaces to be bonded by an ion beam or plasma such as Ar, or cutting binding species to expose activate binding species from the surfaces. After an activation process, joining is typically performed at substantially normal temperature without a heating process. In some cases, however, the heating process is performed at 200° C. or less to increase bonding strength.

Subsequently, an annealing process is performed at about 200° C. to expand the Cu film H32 and the Cu film H31 and join these to each other (FIG. 6C). Consequently, the resonance device 2 is formed. The other processes are the same as those according to the first embodiment.

The Cu films H32 and H31 can be replaced with, for example, a Ni (nickel) film and/or an Au (gold) film. Examples of the material of each insulating film L41' include $SiO_2$ (silicon dioxide), SiN (silicon nitride), polyimide, and BCB (Benzocyclobutene).

Third Exemplary Embodiment

Figure 7:
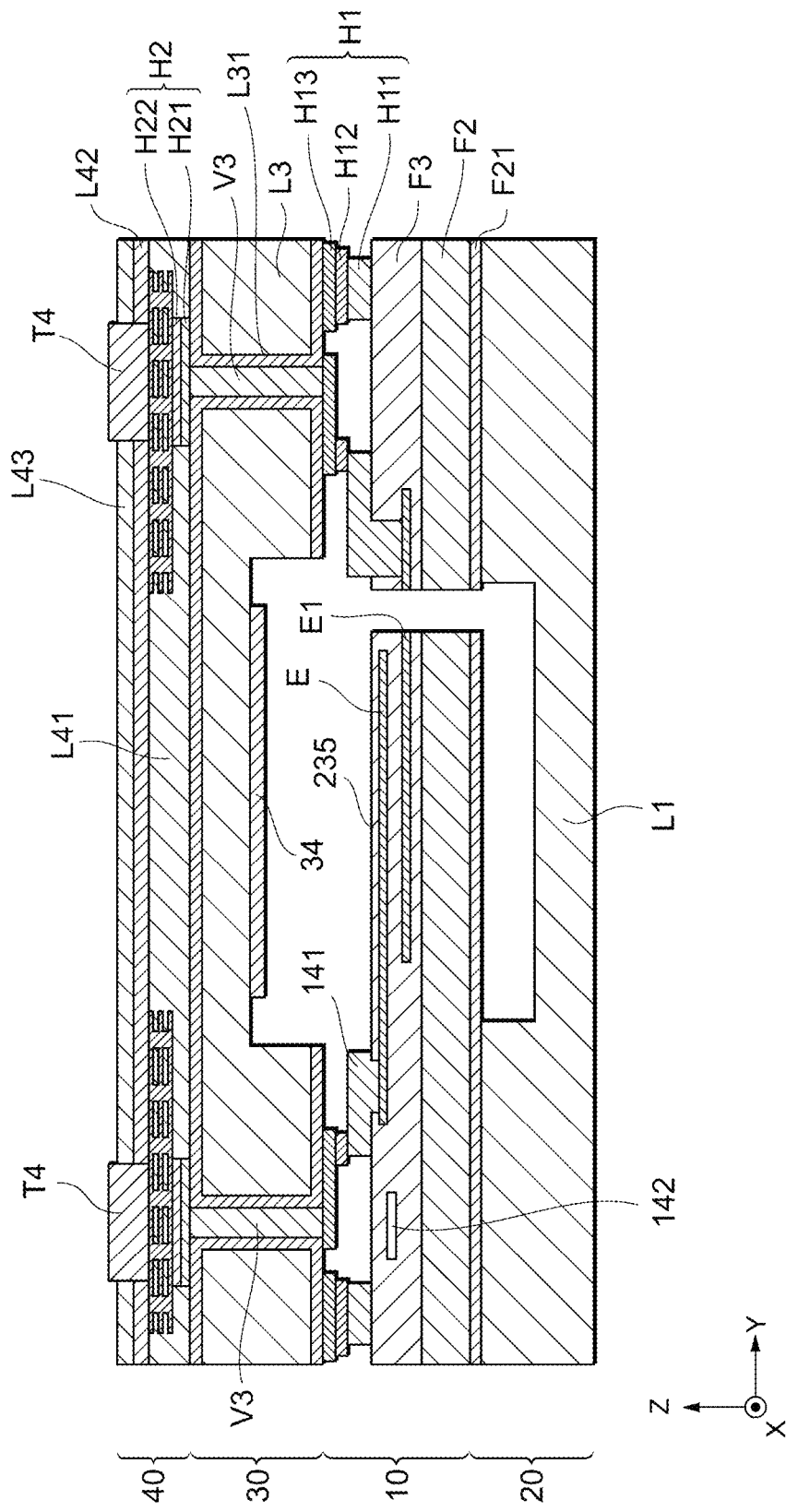
FIG. 7 schematically illustrates an example of a sectional structure of a resonance device according to a third exemplary embodiment.

Differences between the structure of a resonance device 3 according to the present embodiment and that according to the first embodiment will now be described. FIG. 7 schematically illustrates an example of a sectional structure of the resonance device 3 according to the present embodiment.

The resonance device 3 according to the present embodiment includes a resonator 11 instead of the resonator 10 according to the first embodiment. The resonator 11 is a temperature-compensated voltage-controlled crystal oscillator (TCXO) that operates at 32 kHz.

The resonator 11 includes a temperature sensor 142 in the piezoelectric film F3. The temperature sensor 142 is a meander resistance temperature sensor that is formed by, for example, a Mo (molybdenum) wiring line. The resonance device 3 according to the present embodiment is configured for temperature correction with high precision because the resonator 11 includes the temperature sensor 142. The other structures and effects are the same as those according to the first embodiment.

Fourth Exemplary Embodiment

Figure 8:
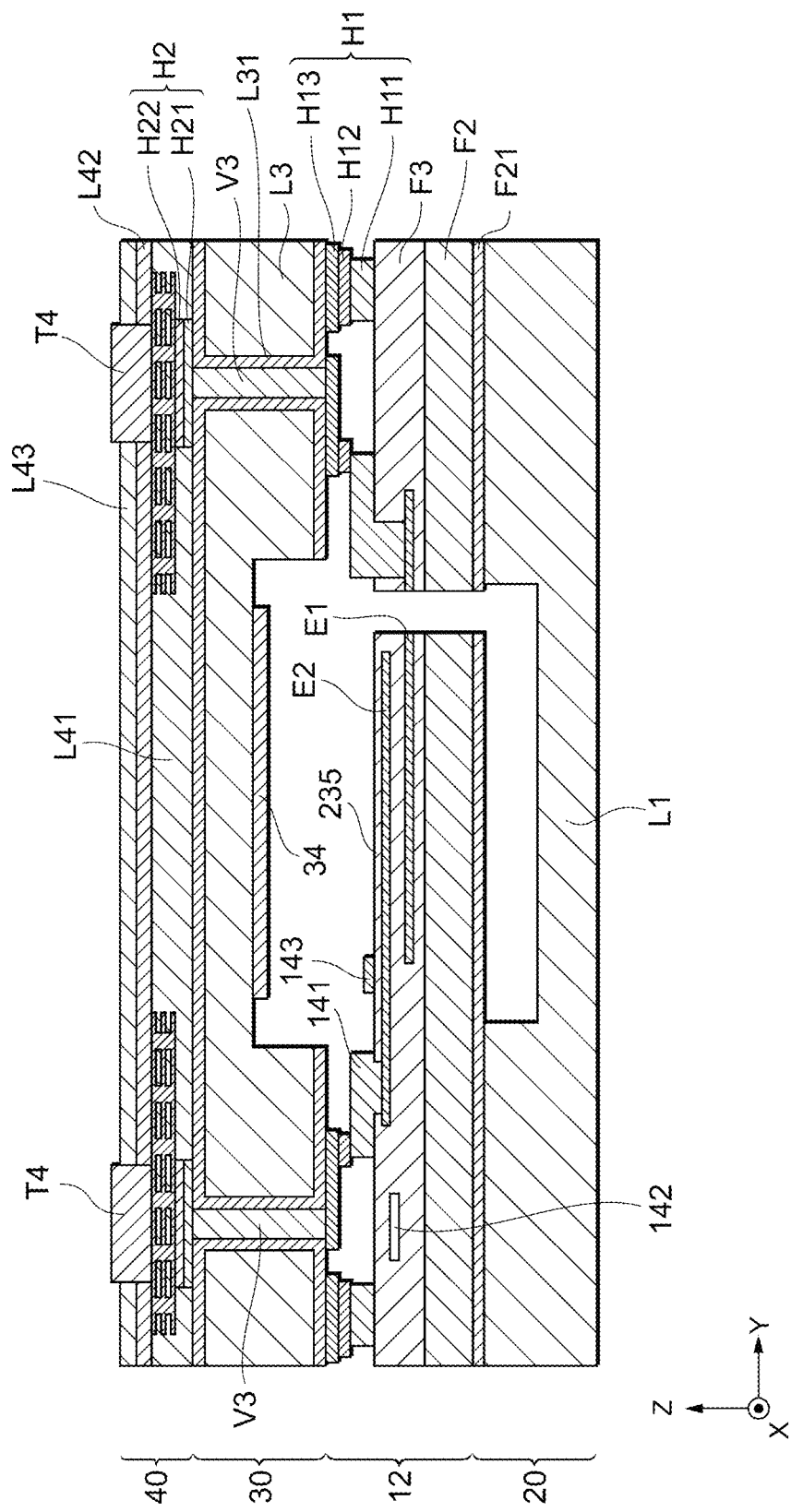
FIG. 8 schematically illustrates an example of a sectional structure of a resonance device according to a fourth exemplary embodiment.

Differences between the structure of a resonance device 4 according to the present embodiment and that according to the first embodiment will now be described. FIG. 8 schematically illustrates an example of a sectional structure of the resonance device 4 according to the present embodiment.

The resonance device 4 according to the present embodiment includes a resonator 12 instead of the resonator 10 according to the first embodiment. The resonator 12 is an oven-controlled crystal oscillator (OCXO) that operates at 32 kHz.

The resonator 12 includes the temperature sensor 142 in the piezoelectric film F3. The temperature sensor 142 is a meander resistance temperature sensor that is formed by, for example, a Mo (molybdenum), polysilicon, NiCr (nichrome), or Pt (platinum) wiring line. The resonator 12 also includes a heater 143 near a location at which the vibration arm 135 and the base 130 are connected to each other. The heater 143 is formed by using a Mo, polysilicon, NiCr, or Pt wiring line. The heater 143 and the resonator 12 are flush with each other and enable efficient temperature correction. The other structures and effects are the same as those according to the first embodiment.

Fifth Exemplary Embodiment

Figure 9:
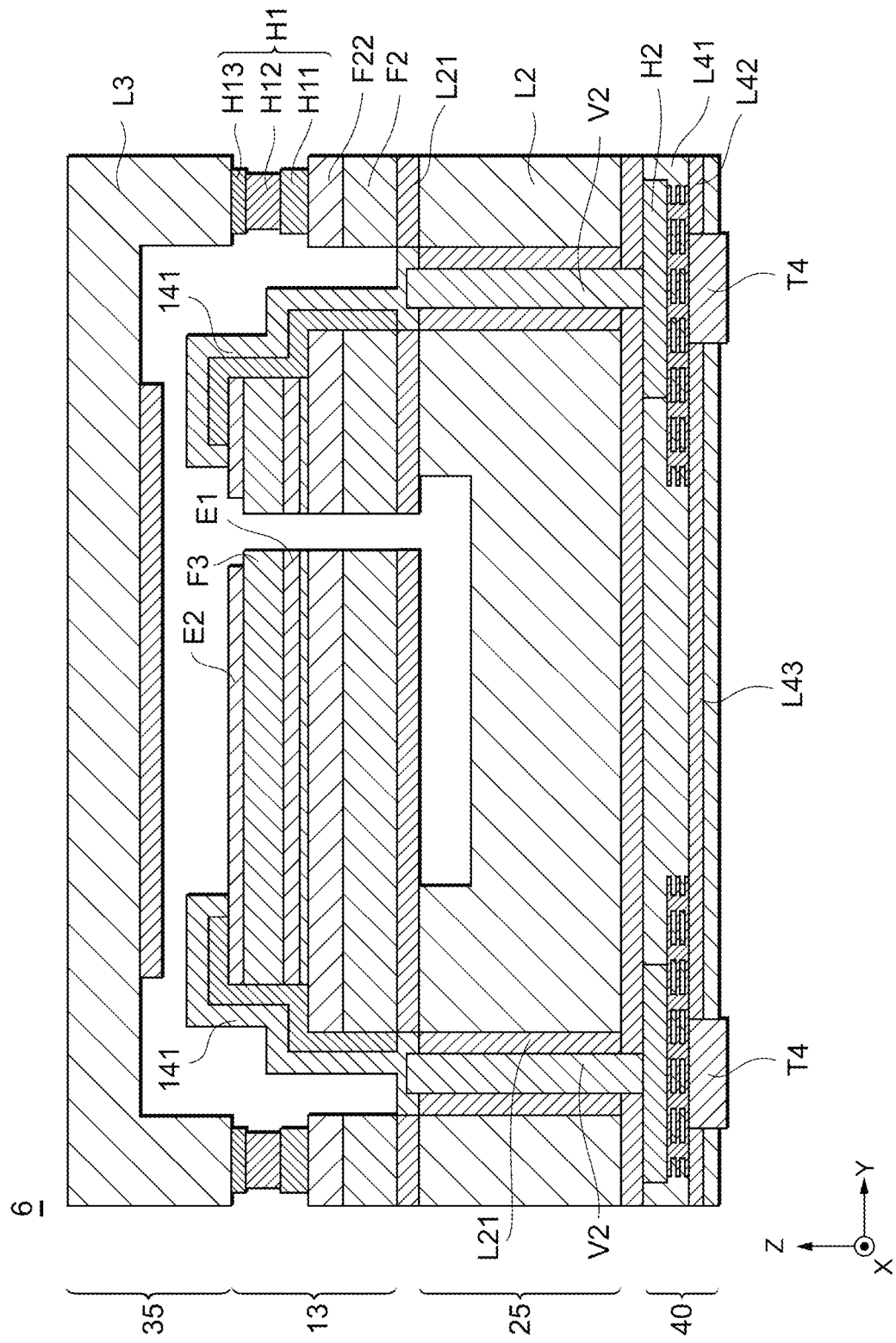
FIG. 9 schematically illustrates an example of a sectional structure of a resonance device according to a fifth exemplary embodiment.

Differences between the structure of a resonance device 5 according to the present embodiment and that according to the first embodiment will now be described. FIG. 9 schematically illustrates an example of a sectional structure of the resonance device 5 according to the present embodiment. The resonance device 5 according to the present embodiment includes an upper lid 35, a lower lid 25, and a resonator 13 instead of the upper lid 30, the lower lid 20, and the resonator 10 of the resonance device 1 according to the first embodiment. The CMOS device 40 is joined to the lower surface of the lower lid 25.

The upper lid 35 does not include the through-electrodes V3 unlike the upper lid 30 according to the first embodiment. Except for this, the structure of the upper lid 35 is the same as that of the upper lid 30 according to the first embodiment.

The lower lid 25 includes through-electrodes V2. The through-electrodes V2 are formed by filling through-holes that are formed in the lower lid 25 with metal such as polycrystalline silicon (Poly-Si). The through-electrodes V2 function as wiring lines that electrically connect the terminals T4 and the voltage applicators 141 to each other. For example, Al films or Ge films are formed between the through-electrodes V2 and the voltage applicators 141.

The front surface of the lower lid 25 that faces the resonator 13, the back surface, and the side surfaces of the through-electrodes V2 are preferably covered by the silicon oxide film L31. The silicon oxide film L31 is formed on a front surface of a Si wafer L2 by, for example, oxidation of the front surface of the Si wafer L3 or chemical vapor deposition (CVD).

Figure 10:
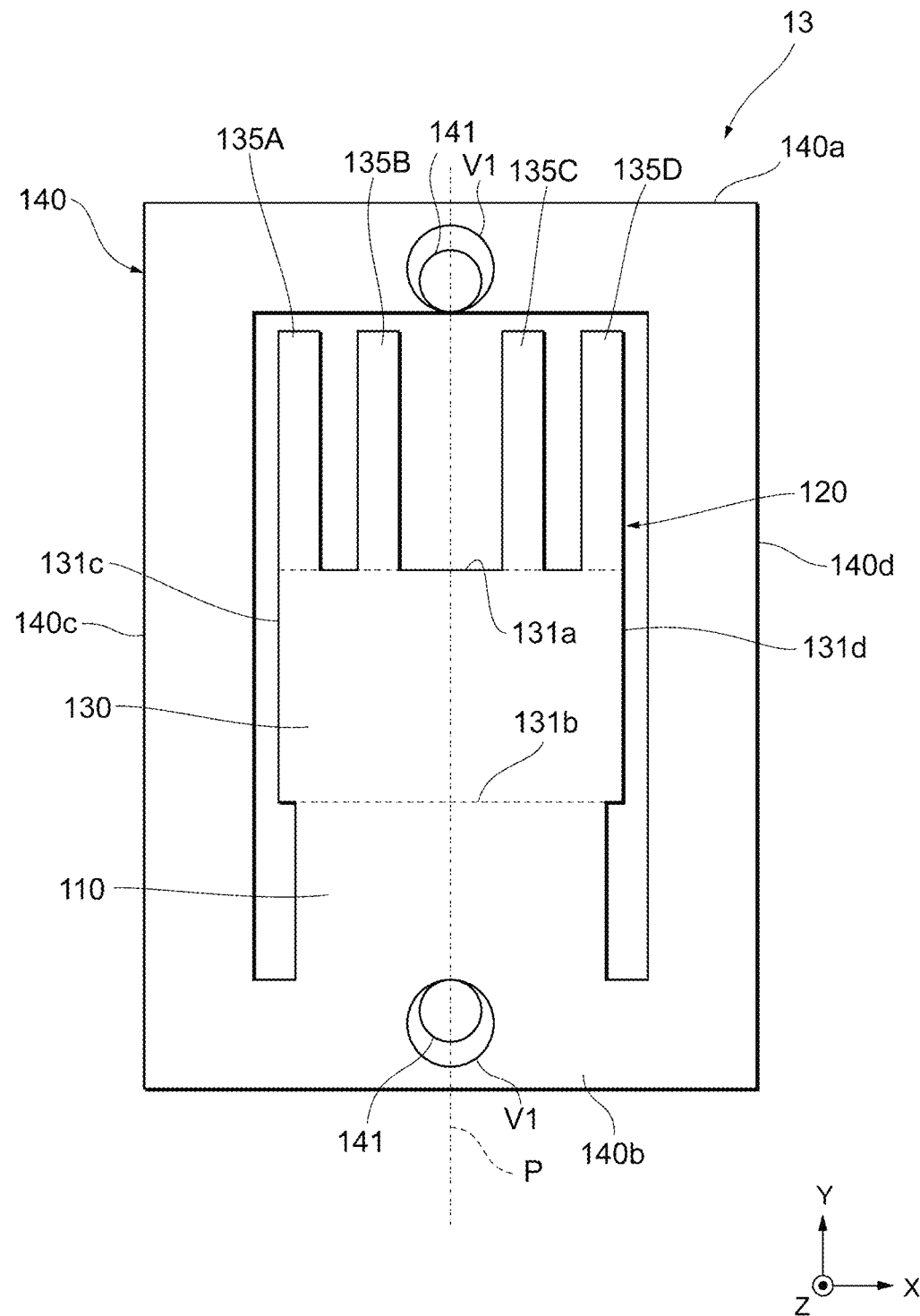
FIG. 10 is a plan view of a resonator according to the fifth exemplary embodiment.

The structure of the resonator 13 will now be described. FIG. 10 is a plan view of the resonator 13 according to the present embodiment. The resonator 13 has through-holes V1 in a region of the hold member 140 that faces the open end of the vibration arm 135 and in a region that is connected to the hold arm.

Referring to FIG. 9 again, the piezoelectric thin film F3, the metal layers E1 and E2, and the protection film 235 are stacked only at locations nearer than the through-holes V1 to the base 130 in the resonator 13. The voltage applicators 141 are formed along the side surfaces of the through-holes V1 up to the through-electrodes V2 in the resonator 13. The other structures and functions are the same as those according to the first embodiment.

Sixth Exemplary Embodiment

Figure 11:
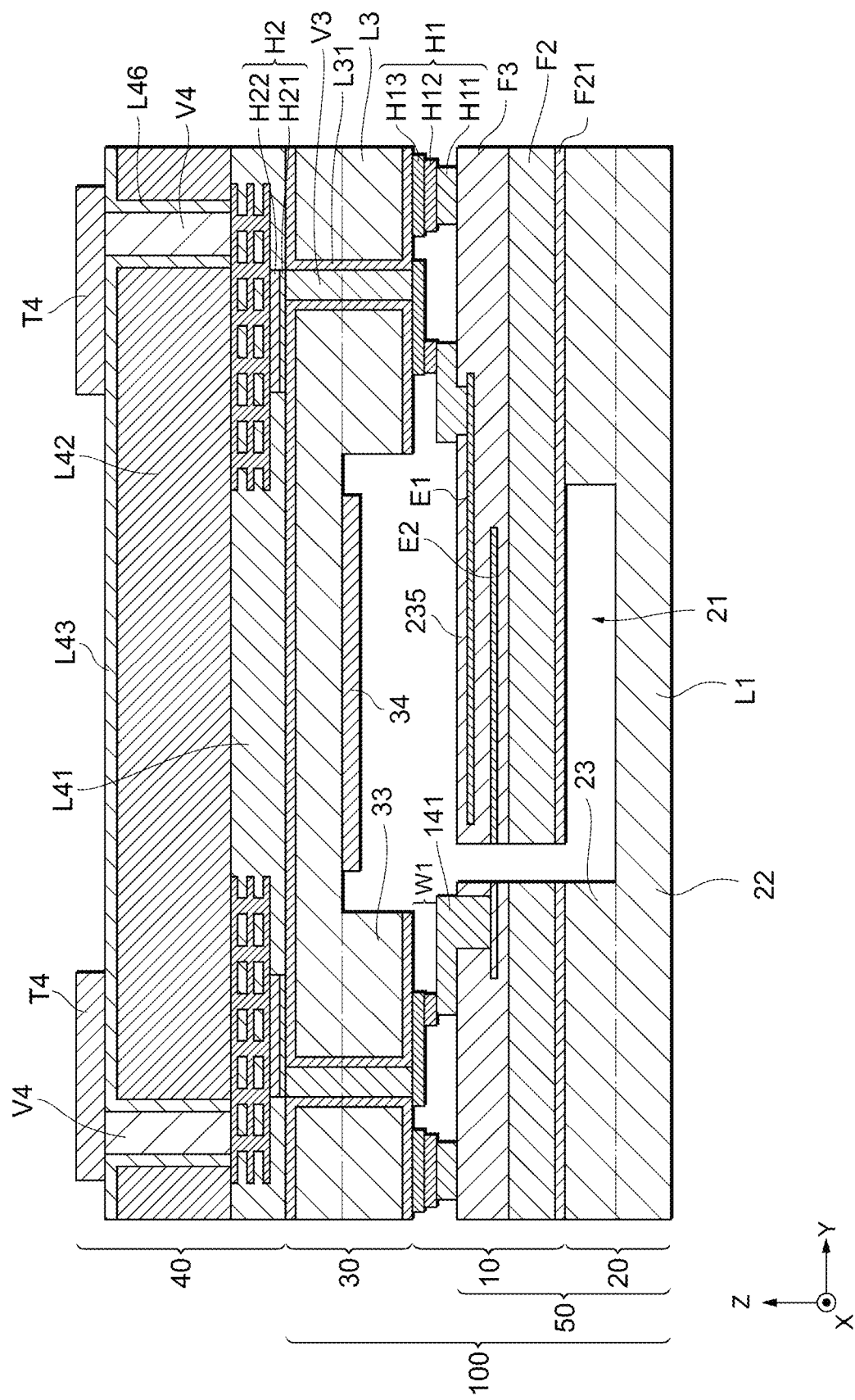
FIG. 11 schematically illustrates an example of a sectional structure of a resonance device according to a sixth exemplary embodiment.

Differences between the structure of a resonance device 6 according to the present embodiment and that according to the first embodiment will now be described. FIG. 11 schematically illustrates an example of a sectional structure of the resonance device 6 according to the present embodiment.

The CMOS device 40 of the resonance device 6 according to the present embodiment includes through-electrodes V4. The through-electrodes V4 of the CMOS device 40 are formed by filling through-holes that are formed in the CMOS device 40 with metal such as polycrystalline silicon (Poly-Si). The through-electrodes V4 function as wiring lines that electrically connect the terminals T4 and the CMOS circuit for oscillation to each other. In the CMOS device 40, the side surface of each through-electrode V4 is preferably covered by a silicon oxide film L46. The silicon oxide film L46 is formed on a front surface of the CMOS layer L42 by, for example, oxidation of the front surface of the CMOS layer L42 or chemical vapor deposition (CVD).

A process of manufacturing the resonance device 6 according to the present embodiment will now be described with reference to FIG. 12A to FIG. 12E. FIG. 12A to FIG. 12E illustrate some processes for joining the upper lid 30 and the CMOS device 40 to each other in the process flow of the resonance device 6. A description of components of the resonance device 6 other than the upper lid 30 and the CMOS device 40 are omitted for convenience of the description. In FIG. 12A to FIG. 12E, the single resonance device 6 of the multiple resonance devices 6 that are formed on a wafer is illustrated for convenience. However, the multiple resonance devices 6 are typically formed on the single wafer as in a normal MEMS process, and the resonance device 6 is subsequently obtained by dividing the wafer.

In a process firstly illustrated in FIG. 12A, the MEMS device 100 and a CMOS wafer 401 are prepared. The CMOS wafer 401 is formed by stacking the CMOS layer L42 and the insulating film L41' in this order. That is, the CMOS wafer 401 does not include the handling Si layer L45 and the BOX layer L44 unlike the CMOS wafer 400 according to the first embodiment.

The above through-electrodes V4 and the silicon oxide films L46 are formed in the CMOS layer L42. The CMOS layer L42 is a substrate composed of, for example, Si and has a thickness of no less than 50 µm and no more than 200 µm in the process in FIG. 12A.

The CMOS circuit for oscillation is formed in the CMOS layer L42, and the insulating film L41' is subsequently formed so as to cover the CMOS circuit for oscillation. The insulating film L41' is composed of the same material as the above wiring layer L41. The insulating film L41' has a thickness of no less than 1 µm and no more than 9 µm in the process in FIG. 12A. The insulating film L41' is partly removed as in the process of manufacturing the resonance device 1 according to the first embodiment. The Al film H22 that is electrically connected to the CMOS circuit for oscillation is formed at the removed location.

As described above in the process of manufacturing the resonance device 1 according to the first embodiment, the insulating film L41' and the Ge film H21 are subsequently formed on the front surface of the upper lid 30 of the MEMS device 100, and the positions of the MEMS device 100 and the CMOS wafer 401 are adjusted such that the center of the Ge film H21 and the center of the Al film H22 coincide with each other.

Figure 12B:
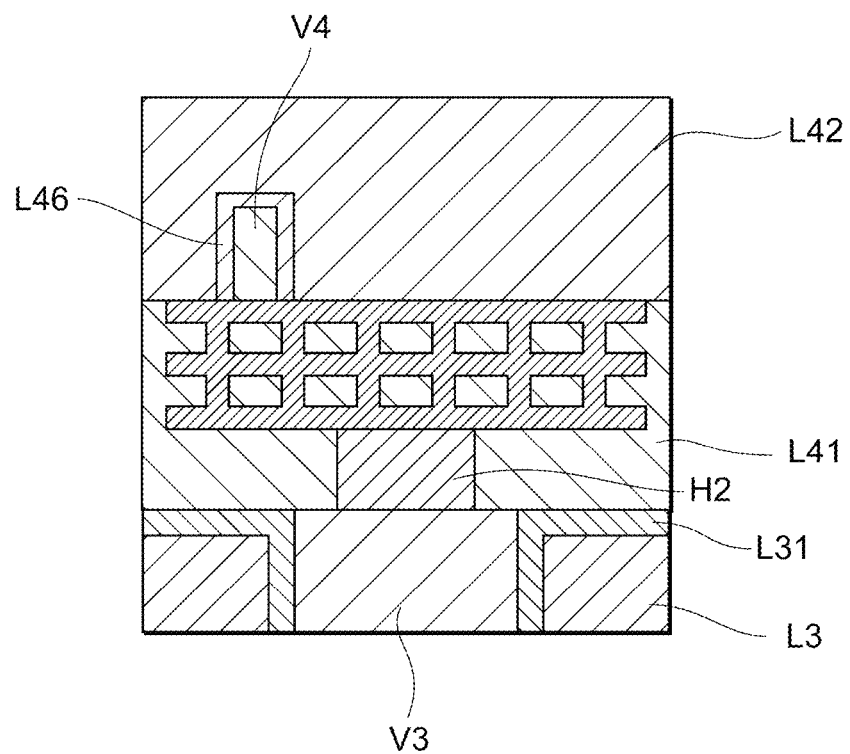
FIG. 12B schematically illustrates the process flow of the resonance device according to the sixth exemplary embodiment.

In a process illustrated in FIG. 12B, after the positions are adjusted, the MEMS device 100 and the CMOS wafer 401 are nipped by, for example, a heater, and pressing and heating processes are performed. Consequently, eutectic coupling occurs between the Al film H22 and the Ge film H21, and the joint H2 is formed. At this time, the insulating film L41' of the CMOS wafer 401 and the insulating film L41' of the MEMS device 100 are crushed, and the wiring layer L41 is formed.

Figure 12C:
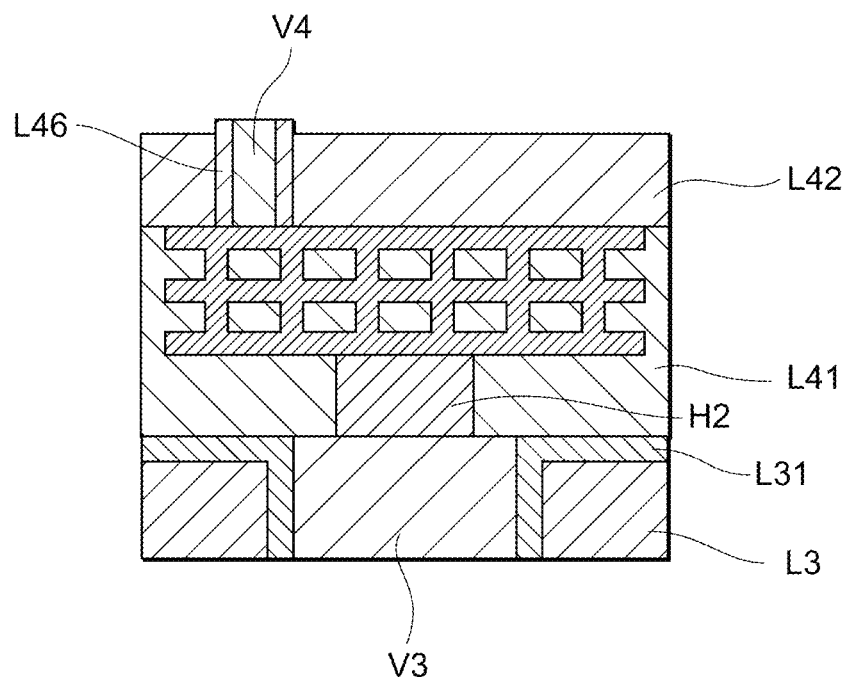
FIG. 12C schematically illustrates the process flow of the resonance device according to the sixth exemplary embodiment.

Subsequently, in a process illustrated in FIG. 12C, the thickness of the CMOS layer L42 is decreased such that the through-electrodes V4 and the silicon oxide films L46 are partly project.

Figure 12D:
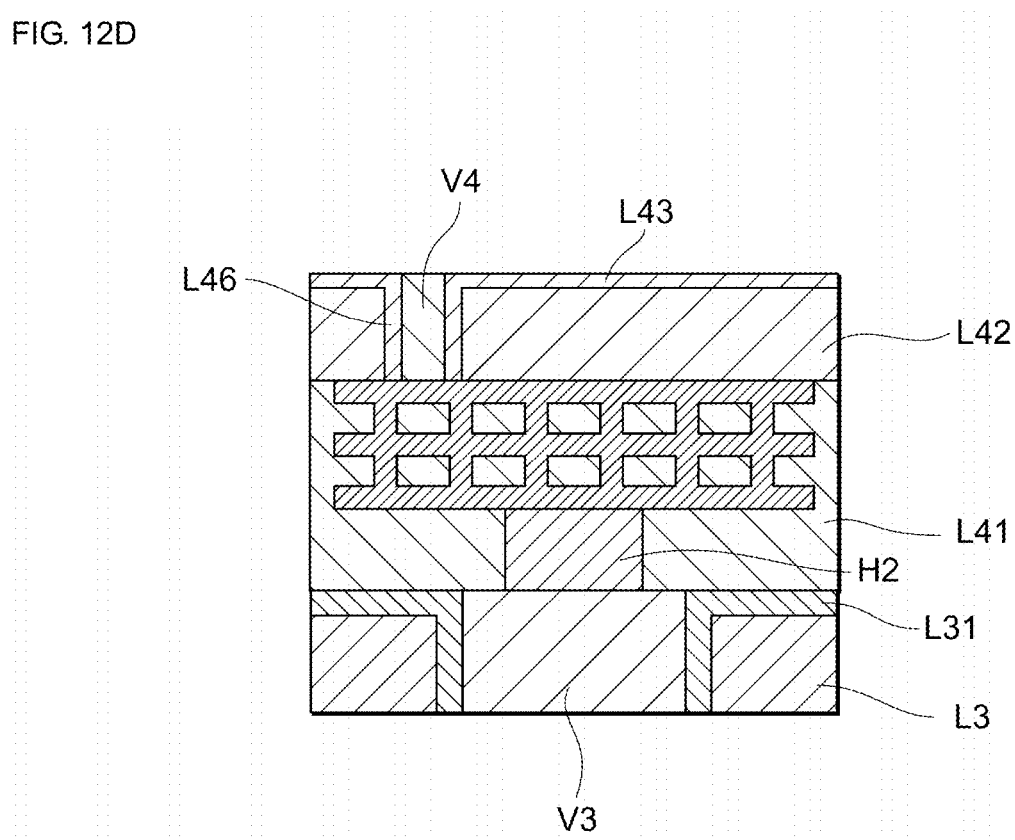
FIG. 12D schematically illustrates the process flow of the resonance device according to the sixth exemplary embodiment.
Figure 12E:
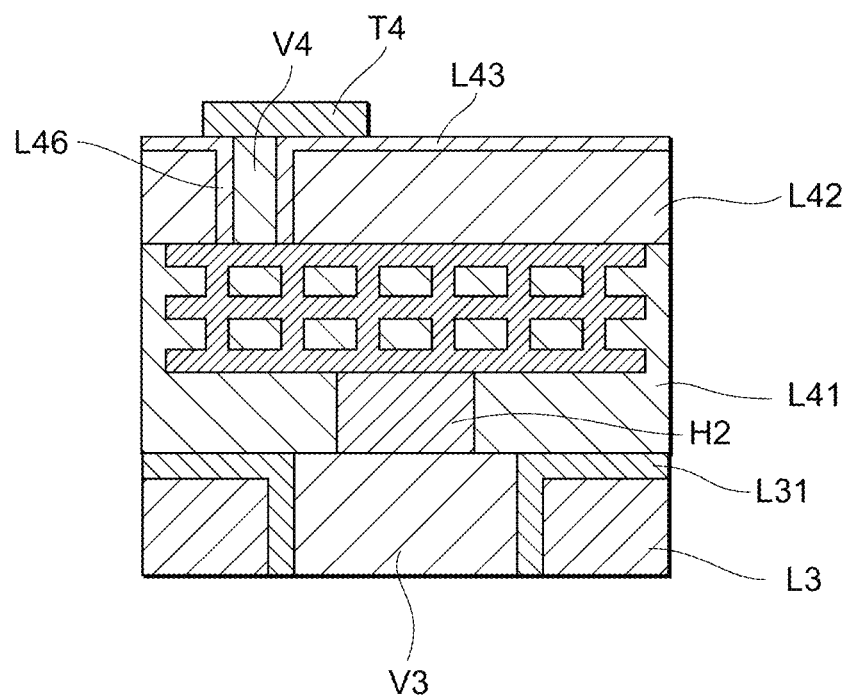
FIG. 12E schematically illustrates the process flow of the resonance device according to the sixth exemplary embodiment.

Subsequently, in a process illustrated in FIG. 12D, the protective layer L43 is formed on the upper surface of the CMOS layer L42. In a subsequent process illustrated in FIG. 12E, the terminals T4 are formed on the protective layer L43 so as to cover the front surfaces of the through-electrodes V4. Subsequently the resonance device 6 that is divided with a dicing machine is obtained.

Seventh Exemplary Embodiment

Differences between the process of manufacturing a resonance device 7 according to the present embodiment and that according to the first embodiment will now be described. The structure of the resonance device 7 according to the present embodiment is substantially the same as that of the resonance device 6 according to the above sixth embodiment, and a description and an illustration thereof are omitted.

A process of manufacturing the resonance device 7 according to the present embodiment will be described with reference to FIG. 13A to FIG. 13D. FIG. 13A to FIG. 13D illustrate some processes for joining the upper lid 30 and the CMOS device 40 to each other in the process flow of the resonance device 7. A description of components of the resonance device 7 other than the upper lid 30 and the CMOS device 40 are omitted for convenience of the description. In FIG. 13A to FIG. 13D, the single resonance device 7 of the multiple resonance devices 7 that are formed on a wafer is illustrated for convenience. However, the multiple resonance devices 7 are typically formed on the single wafer as in a normal MEMS process, and the resonance device 7 is subsequently obtained by dividing the wafer.

In a process firstly illustrated in FIG. 13A, the MEMS device 100 and a CMOS wafer 402 are prepared. The CMOS wafer 402 is formed by stacking the CMOS layer L42 and the insulating film L41' in this order. The CMOS wafer 402 does not include the handling Si layer L45 and the BOX layer L44 as in the CMOS wafer 401 according to the sixth embodiment.

In the process in FIG. 13A, the through-electrodes V4 and the silicon oxide films L46 are not formed in the CMOS layer L42 of the CMOS wafer 402.

The CMOS circuit for oscillation is formed in the CMOS layer L42, and the insulating film L41' is subsequently formed so as to cover the CMOS circuit for oscillation. The insulating film L41' is composed of the same material as the above wiring layer L41. The insulating film L41' is partly removed as in the process of manufacturing the resonance device 1 according to the first embodiment. The Al film H22 that is electrically connected to the CMOS circuit for oscillation is formed at the removed location.

As in the process of manufacturing the resonance device 1 according to the first embodiment, the insulating film L41' and the Ge film H21 are subsequently formed on the front surface of the upper lid 30 of the MEMS device 100, and the positions of the MEMS device 100 and the CMOS wafer 402 are adjusted such that the center of the Ge film H21 and the center of the Al film H22 coincide with each other.

Figure 13B:
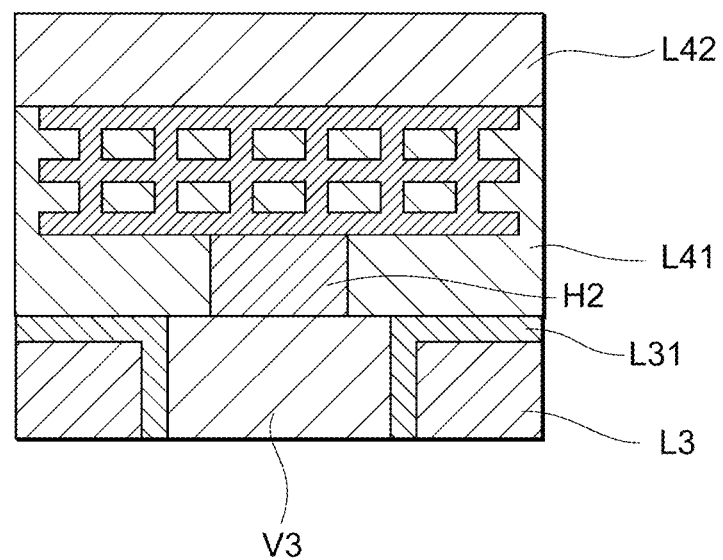
FIG. 13B schematically illustrates the process flow of the resonance device according to the seventh exemplary embodiment.

In a process illustrated in FIG. 13B, after the positions are adjusted, the MEMS device 100 and the CMOS wafer 402 are nipped by, for example, a heater, and pressing and heating processes are performed. Consequently, eutectic coupling occurs between the Al film H22 and the Ge film H21, and the joint H2 is formed. At this time, the insulating film L41' of the CMOS wafer 402 and the insulating film L41' of the MEMS device 100 are crushed, and the wiring layer L41 is formed.

Figure 13C:
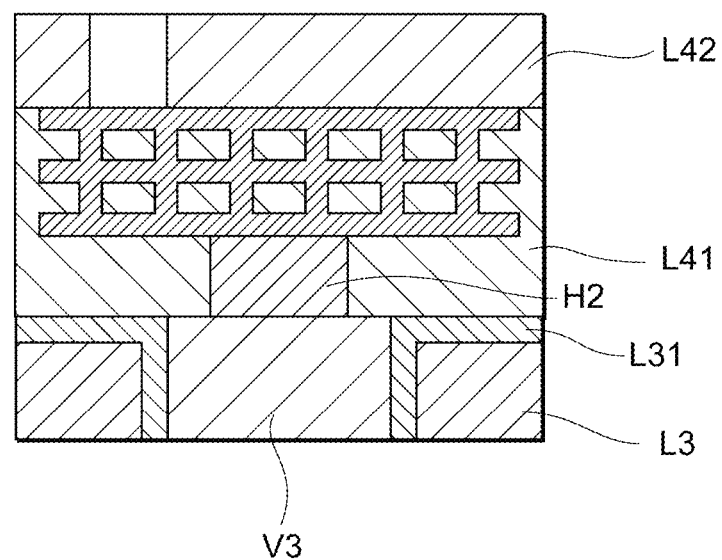
FIG. 13C schematically illustrates the process flow of the resonance device according to the seventh exemplary embodiment.

Subsequently, in a process illustrated in FIG. 13C, the CMOS layer L42 is partly removed, and through-holes are formed in the CMOS layer L42.

Figure 13D:
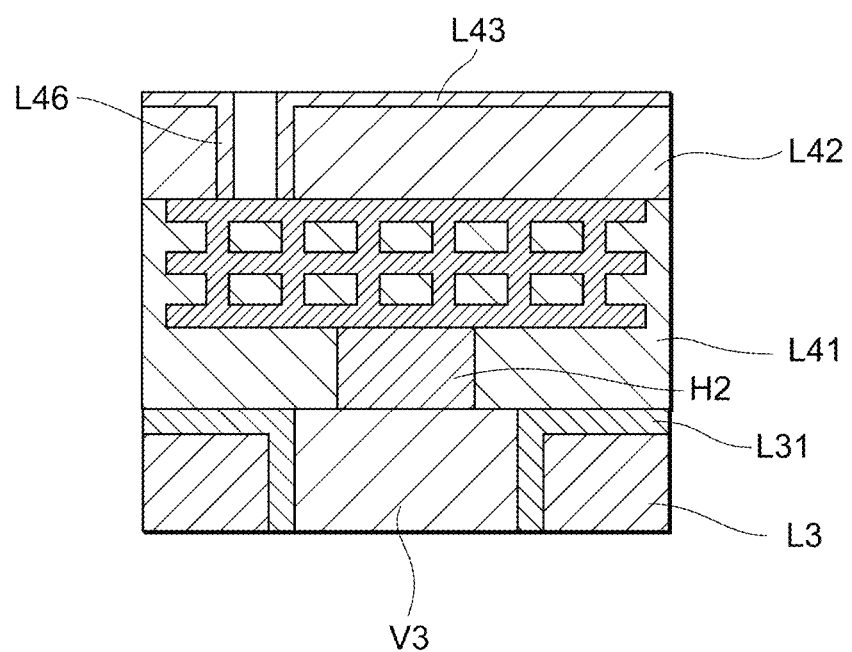
FIG. 13D schematically illustrates the process flow of the resonance device according to the seventh exemplary embodiment.

Subsequently, in a process illustrated in FIG. 13D, the protective layer L43 is formed on the upper surface of the CMOS layer L42, and the silicon oxide films L46 are formed on the side surfaces of the through-holes. In a subsequent process, the through-holes are filled with metal such as Cu (copper) to form the through-electrodes V4. The terminals T4 are formed on the protective layer L43 so as to cover the front surfaces of the through-electrodes V4. Subsequently, the resonance device 7 that is divided with a dicing machine is obtained.

Additional Exemplary Embodiments

In the examples described according to the above embodiments, the resonance devices according to the present invention are used as MEMS vibrators. However, it should be appreciated that the application is not limited thereto. Examples thereof include an optical scanner MEMS mirror, a piezoelectric microphone, a piezoelectric transducer, an electrostatic MEMS element, an electromagnetic driving MEMS element, a piezoelectric resistance MEMS element, a gyro-sensor, and an acceleration sensor. The application may include a MHz vibrator for a MHz oscillator.

Moreover, the exemplary embodiments of the present invention are described by way of example.

The resonance device 1 according to the first invention of the present invention includes the resonator 10 that includes the lower electrode E1, the upper electrode E2, and the piezoelectric film F3 that is formed between the lower electrode E1 and the upper electrode E2, the MEMS device 100 that includes the upper lid 30 that faces the upper electrode E2 of the resonator 10 and the lower lid 20 that faces the lower electrode E1 of the resonator 10 and that seals the resonator 10 together with the upper lid 30, and the CMOS device 40 that is mounted on the surface of the upper lid 30 or the lower lid 20 opposite the surface that faces the resonator 10. Moreover, the CMOS device 40 includes the CMOS layer L42 and the protective layer L43 that is disposed on the surface of the CMOS layer L42 opposite the surface that faces the resonator 10. The upper lid 30 or the lower lid 20 that is joined to the CMOS device 40 includes the through-electrode that electrically connects the CMOS device and the resonator to each other. The CMOS device 40 of the resonance device 1 according to the present embodiment thus includes no handling layer. Consequently, the thickness of the CMOS device 40 can be decreased, and the thickness of the resonance device 1 can be decreased. In the resonance device 1 according to the present embodiment, the CMOS device 40 is connected outside the MEMS device. This enables a high degree of vacuum in the vibration space of the MEMS device to be stably obtained even when the material of the CMOS circuit of the CMOS device 40 causes outgassing.

The CMOS device 40 preferably includes the external terminals T4 near the surface of the CMOS layer L41 on which the protective layer L43 is disposed.

The MEMS device 100 and the CMOS device 40 are preferably joined to each other by eutectic bonding. The MEMS device 100 and the CMOS device 40 are preferably joined to each other by eutectic of aluminum and germanium. In the case where the CMOS device 40 and the MEMS device 100 are joined to each other with the same metal as the upper lid 30 of the MEMS device 100 and the resonator 10 are joined to each other, a process can be simplified.

The MEMS device 100 and the CMOS device 40 are preferably electrically connected to each other by activation bonding of a silicon oxide and by joining the same metal materials to each other.

The upper lid 30 preferably includes the getter film 34 on the surface that faces the resonator 10. This enables a high degree of an airtight state in the vibration space of the MEMS device 100 to be maintained.

A method of manufacturing a resonance device according to an exemplary embodiment includes a process of preparing the resonator 10 that includes the lower electrode E1, the upper electrode E2, and the piezoelectric film F3 that is formed between the lower electrode E1 and the upper electrode E2. Moreover, the MEMS device 100 includes the upper lid 30 that faces the upper electrode E2 of the resonator 10 and the lower lid 20 that faces the lower electrode E1 of the resonator 10 and that seals the resonator 10 together with the upper lid 30, the upper lid 30 or the lower lid 20 including the through-electrodes V3 (or V2). The method further includes a process of preparing the CMOS device 40 that includes the CMOS layer L42 and the wiring layer L41 that is disposed on the CMOS layer L42, a process of mounting the CMOS device 40 on the MEMS device 100 such that the wiring layer L41 of the CMOS device 40 faces the surface of the upper lid 30 or the lower lid 20 that includes the through-electrodes V3 (or V2) of the MEMS device 100 opposite the surface that faces the resonator 10, and a process of forming the protective layer L43 on the surface of the CMOS layer L42 of the CMOS device 40 opposite the surface that faces the resonator 10.

The exemplary embodiments are described above to make the present invention easy to understand and do not limit the present invention. Thus, it is noted that the exemplary embodiments of the present invention can be modified and altered without departing from the spirit thereof. That is, embodiments obtained by appropriately modifying the embodiments by a person skilled in the art are included in the scope of the present invention provided that the embodiments have the features of the present invention. For example, the components according to the embodiments, the arrangement thereof, the material, conditions, shape, and size are not limited to those described above by way of example and can be appropriately changed. It goes without saying that the embodiments are described by way of example, and that the components according to the different embodiments can be partially replaced or combined. These having the features of the present invention are also included in the scope of the present invention.

REFERENCE SIGNS LIST 1, 2, 3, 4, 5, 6, 7 resonance device
10, 11, 12, 13 resonator
20, 25 lower lid
21 recessed portion
22 bottom plate
23 side wall
30, 35 upper lid
31 recessed portion
33 side wall
34 getter layer
40 CMOS device
50 substrate
100 MEMS device
110 hold arm
120 vibration member
120A vibration member 127 joint
130 base
135 vibration arm
140 hold member
141 voltage applicator
142 temperature sensor
143 heater
235 protection film
400, 401, 402 CMOS wafer

The invention claimed is:

1. A resonance device comprising:
  a resonator that includes a lower electrode, an upper electrode, and a piezoelectric film disposed between the lower and upper electrodes;
  a MEMS device that includes an upper lid that faces the upper electrode of the resonator and a lower lid that faces the lower electrode of the resonator and that seals the resonator together with the upper lid; and
  a CMOS device that is mounted on a surface of the upper lid or the lower lid opposite the resonator and that includes a CMOS layer and a protective layer disposed on a surface of the CMOS layer opposite the upper or lower lid of which the CMOS device is mounted,
  wherein the upper lid or the lower lid on which the CMOS device is mounted includes at least one through-electrode that electrically connects the CMOS device to the resonator.

2. The resonance device according to claim 1, wherein the CMOS device includes an external terminal adjacent the surface of the CMOS layer on which the protective layer is disposed.

3. The resonance device according to claim 1, wherein the MEMS device is joined to the CMOS device by eutectic bonding.

4. The resonance device according to claim 3, wherein the MEMS device is joined to the CMOS device by eutectic of aluminum and germanium.

5. The resonance device according to claim 1, wherein the MEMS device is electrically connected to the CMOS device by activation bonding of same insulating films and by joining same metal materials to each other.

6. The resonance device according to claim 1, wherein the upper lid or the lower lid includes a getter film on the surface that faces the resonator.

7. The resonance device according to claim 6, wherein the getter film comprises titanium and is configured to absorb a gas outgassing in a vibration space defined by the upper and lower lids.

8. The resonance device according to claim 1, wherein the resonator includes a vibration member, a frame that at least partially surrounds the vibration member, and a holding arm that couples the vibration member to the frame.

9. The resonance device according to claim 8, wherein the vibration member comprises a base coupled to the holding arm and a plurality of vibration arms extending parallel to each other and in a direction opposite the holding arm.

10. The resonance device according to claim 9, wherein at least one voltage applicator is formed on the frame and coupled to the through-electrode, such that the at least one voltage applicator is configured to apply an alternating electric field to the resonator.

11. The resonance device according to claim 1, wherein the resonator is coupled to upper lid by a joint that is formed by stacking an Al layer, a Ge layer, and an Al layer.

12. The resonance device according to claim 1, wherein the resonator includes a temperature sensor and a heater configured to adjust a temperature of the resonator based on a temperature measured by the temperature sensor.

13. The resonance device according to claim 1, wherein the CMOS device further comprises a wiring layer disposed between the CMOS layer and the upper lid of the MEMS device.

14. The resonance device according to claim 13, wherein the wiring layer comprises a multilayer of an insulating film and a wiring line and is configured to protect the CMOS device circuit from oscillation that is formed in the CMOS layer during excitation of the resonator.

15. A resonance device comprising:
  a resonator;
  a MEMS device that includes a first lid that faces a first surface of the resonator and a second lid that faces a second surface of the resonator opposite the first surface, such that the first and second lids seals the resonator in a vacuum state; and
  a CMOS device that is mounted on a surface of the first lid opposite the resonator and that includes a CMOS layer and a protective layer disposed on a surface of the CMOS layer opposite the first lid,
  wherein the first lid on which the CMOS device is mounted includes at least one through-electrode that electrically connects the CMOS device to the resonator.

16. The resonance device according to claim 15, wherein the resonator includes a lower electrode, an upper electrode, and a piezoelectric film disposed between the lower and upper electrodes.

17. The resonance device according to claim 15, wherein the CMOS device includes an external terminal adjacent the surface of the CMOS layer on which the protective layer is disposed.

18. The resonance device according to claim 15, wherein the MEMS device is joined to the CMOS device by eutectic bonding.

19. The resonance device according to claim 15, wherein the MEMS device is electrically connected to the CMOS device by activation bonding of same insulating films and by joining same metal materials to each other.

20. A method of manufacturing a resonance device, the method comprising:
  preparing a resonator that includes a lower electrode, an upper electrode, and a piezoelectric film disposed between the lower and upper electrodes, and a MEMS device that includes an upper lid that faces the upper electrode, and a lower lid that faces the lower electrode and that seals the resonator together with the upper lid, with the upper lid or the lower lid including a through-electrode;
  preparing a CMOS device that includes a CMOS layer and a wiring layer that is disposed on the CMOS layer;
  mounting the CMOS device on the MEMS device such that the wiring layer of the CMOS device faces a surface of the upper lid or the lower lid that includes the through-electrode of the MEMS device opposite a surface that faces the resonator; and
  forming a protective layer on a surface of the CMOS layer of the CMOS device opposite a surface that faces the resonator.

* * * * *